US012563954B2

(12) United States Patent
Hai et al.

(10) Patent No.: US 12,563,954 B2
(45) Date of Patent: Feb. 24, 2026

(54) DISPLAY PANEL AND DISPLAY DEVICE

(71) Applicant: BOE Technology Group Co., Ltd., Beijing (CN)

(72) Inventors: Xiaoquan Hai, Beijing (CN); Yingzi Wang, Beijing (CN); Xue Dong, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 450 days.

(21) Appl. No.: 18/024,690

(22) PCT Filed: Jun. 15, 2022

(86) PCT No.: PCT/CN2022/098990
§ 371 (c)(1),
(2) Date: Mar. 3, 2023

(87) PCT Pub. No.: WO2023/240498
PCT Pub. Date: Dec. 21, 2023

(65) Prior Publication Data
US 2024/0284768 A1      Aug. 22, 2024

(51) Int. Cl.
*H10K 59/80* (2023.01)
*H10K 39/34* (2023.01)
*H10K 59/38* (2023.01)

(52) U.S. Cl.
CPC ......... *H10K 59/8792* (2023.02); *H10K 39/34* (2023.02)

(58) Field of Classification Search
CPC ..... H10K 59/8792; H10K 59/38; H10K 39/34
See application file for complete search history.

(56) References Cited

U.S. PATENT DOCUMENTS

| | | | |
|---|---|---|---|
| 2021/0226175 A1 | 7/2021 | Cao et al. | |
| 2022/0157982 A1* | 5/2022 | Chiu ................. | H10D 30/0285 |
| 2022/0376215 A1 | 11/2022 | Gao et al. | |

FOREIGN PATENT DOCUMENTS

| | | |
|---|---|---|
| CN | 110361887 A | 10/2019 |
| CN | 110379939 A | 10/2019 |

(Continued)

OTHER PUBLICATIONS

CN202280001771.5 first office action dated Nov. 20, 2025.

*Primary Examiner* — Joseph L Williams
(74) *Attorney, Agent, or Firm* — IPro, PLLC

(57) ABSTRACT

Provided is a display panel, including a driver backplane, a plurality of light-emitting devices, a black matrix, and a color resistance layer. The black matrix is provided with a plurality of first light-passing holes in one-to-one correspondence with the plurality of light-emitting devices; and the color resistance layer includes a plurality of color resistance blocks in one-to-one correspondence with the plurality of first light-passing holes, and an auxiliary color resistance structure disposed between any adjacent color resistance blocks; wherein an orthographic projection of each first light-passing hole onto the driver backplane falls within an orthographic projection of the color resistance block corresponding to the first light-passing hole onto the driver backplane, and an orthographic projection of the auxiliary color resistance structure onto the driver backplane is at least partially overlapped with orthographic projections of the black matrix onto the driver backplane.

20 Claims, 12 Drawing Sheets

(56)          References Cited

FOREIGN PATENT DOCUMENTS

| | | | |
|---|---|---|---|
| CN | 210324240 | U | 4/2020 |
| CN | 111668388 | A | 9/2020 |
| CN | 112750962 | A | 5/2021 |
| CN | 112951888 | A | 6/2021 |
| CN | 113314684 | A | 8/2021 |
| CN | 113629112 | A | 11/2021 |
| CN | 114583079 | A | 6/2022 |
| CN | 114744012 | A | 7/2022 |
| WO | 2020107236 | A1 | 6/2020 |

* cited by examiner

00

000

300

000

400

400

400

000

000

DISPLAY PANEL AND DISPLAY DEVICE

This application is a U.S. national stage of international application No. PCT/CN2022/098990, filed on Jun. 15, 2022, entitled "DISPLAY PANEL AND DISPLAY DEVICE", the disclosure of which is herein incorporated by reference in its entirety.

TECHNICAL FIELD

The present disclosure relates to the field of display technologies, in particular to a display panel and a display device.

BACKGROUND OF THE INVENTION

Organic light-emitting diodes (OLEDs), which are current-type light-emitting devices, are increasingly used in the field of high-performance displays due to their characteristics of low power consumption, self-luminescence, high color saturation, fast response, wide viewing angle, and flexibility.

SUMMARY OF THE INVENTION

The embodiments of the present disclosure provide a display panel and a display device. The technical solutions are as follows.

In one aspect, a display panel is provided, including:

a driver backplane;

a plurality of light-emitting devices disposed on a side of the driver backplane;

a black matrix disposed on a side, distal to the driver backplane, of the plurality of light-emitting devices, wherein the black matrix is provided with a plurality of first light-passing holes in one-to-one correspondence with the plurality of light-emitting devices, and an orthographic projection of each light-emitting device onto the driver backplane falls within an orthographic projection of the first light-passing hole corresponding to the light-emitting device onto the driver backplane; and a color resistance layer disposed on a side, distal to the driver backplane, of the black matrix, wherein the color resistance layer includes a plurality of color resistance blocks in one-to-one correspondence with the plurality of first light-passing holes, and an auxiliary color resistance structure disposed between any adjacent color resistance blocks;

wherein an orthographic projection of each first light-passing hole onto the driver backplane falls within an orthographic projection of the color resistance block corresponding to the first light-passing hole onto the driver backplane, and an orthographic projection of the auxiliary color resistance structure onto the driver backplane is at least partially overlapped with orthographic projections of the black matrix onto the driver backplane.

In some embodiments, the auxiliary color resistance structure is provided with a plurality of opening areas in one-to-one correspondence with the plurality of color resistance blocks, and a boundary of an orthographic projection of each opening area onto the driver backplane is in coincidence with a boundary of the orthographic projection of the color resistance block corresponding to the opening area onto the driver backplane.

In some embodiments, the orthographic projection of the black matrix onto the driver backplane falls within the orthographic projection of the auxiliary color resistance structure onto the driver backplane.

In some embodiments, the plurality of color resistance blocks include at least two types of color resistance blocks with different colors, a color of the auxiliary color resistance structure being the same as a color of at least one type of the color resistance blocks.

In some embodiments, the plurality of color resistance blocks include red color resistance blocks, green color resistance blocks, and blue color resistance blocks;

the color of each portion in the auxiliary color resistance structure is the same, and the color of the auxiliary color resistance structure is any one of red, green, or blue;

or the auxiliary color resistance structure includes at least two of a first portion having a same color as the red color resistance block, a second portion having a same color as the green color resistance block, and a third portion having a same color as the blue color resistance block.

In some embodiments, in a case that the auxiliary color resistance structure includes a first portion, the first portion is at least distributed on one side of the red color resistance block; in a case that the auxiliary color resistance structure includes a second portion, the second portion is at least distributed on one side of the green color resistance block; in a case that the auxiliary color resistance structure includes a third portion, the third portion is at least distributed on one side of the blue color resistance block.

In some embodiments, in a case that the auxiliary color resistance structure includes a first portion, a second portion, and a third portion, an area of an orthographic projection of the third portion onto the driver backplane is smaller than an area of an orthographic projection of the first portion onto the driver backplane, and is larger than an area of an orthographic projection of the second portion onto the driver backplane.

In some embodiments, the display panel further includes a first cover layer disposed between the black matrix and the color resistance layer, a thickness of the first cover layer being greater than or equal to a thickness of the black matrix.

In some embodiments, the display panel further includes a second cover layer disposed on a side, distal to the driver backplane, of the color resistance layer, and an inorganic cover layer disposed on a side, distal to the driver backplane, of the second cover layer, a refractive index of the inorganic cover layer being greater than a refractive index of the second cover layer.

In some embodiments, a thickness of the inorganic cover layer ranges from 500 angstroms to 1500 angstroms.

In some embodiments, the display panel further includes a plurality of photosensitive devices disposed on one side of the driver backplane, the black matrix is further provided with a plurality of second light-passing holes in one-to-one correspondence with the plurality of photosensitive devices, and the auxiliary color resistance structure is provided with a plurality of third light-passing holes in one-to-one correspondence with the plurality of photosensitive devices;

wherein an orthographic projection of each photosensitive device onto the driver backplane is at least partially overlapped with an orthographic projection of the second light-passing hole corresponding to the photosensitive device onto the driver backplane, and is at least partially overlapped with an orthographic projection of the third light-passing hole corresponding to the photosensitive device onto the driver backplane.

In some embodiments, a boundary of the orthographic projection of the photosensitive device onto the driver backplane is in coincidence with a boundary of the orthographic projection of the corresponding second light-passing hole onto the driver backplane, and is in coincidence with a boundary of the orthographic projection of the corresponding third light-passing hole onto the driver backplane.

In some embodiments, the display panel further includes a packaging layer disposed on a side, distal to the driver backplane, of the plurality of light-emitting devices, and a touch layer disposed on a side, distal to the driver backplane, of the packaging layer;

wherein the touch layer is disposed between the packaging layer and the black matrix and is provided with a touch signal line, an orthographic projection of the touch signal line onto the driver backplane being not overlapped with the orthographic projections of the plurality of photosensitive devices onto the driver backplane.

In some embodiments, the display panel is a foldable display panel and further includes an ultra-thin glass UTG cover plate disposed on a side, distal to the driver backplane, of the color resistance layer.

In another aspect, a display device is provided, including a power supply assembly and the display panel as described above, and the power supply assembly is configured to supply power to the display panel.

BRIEF DESCRIPTION OF THE DRAWINGS

For clearer descriptions of the technical solutions according to the embodiments of the present disclosure, the drawings required to be used in the description of the embodiments are briefly introduced below. It is obvious that the drawings in the description below are only some embodiments of the present disclosure, and it is obvious for those skilled in the art that other drawings can be obtained according to the drawings without creative efforts.

DETAILED DESCRIPTION

For clearer descriptions of the objects, technical solutions, and advantages of the present disclosure, the embodiments of the present disclosure are further described in detail below with reference to the drawings.

At present, in order to reduce the reflectance of the internal structure of the OLED display panel to ambient light, the following two modes are generally adopted. In the first mode, a circular polarizer is attached to the light-emergent side of the OLED display panel, and the circular polarizer reduces the amount of ambient light emitted from the light-emergent surface after being reflected by the internal structure of the OLED display panel once entering the OLED display panel. In the second mode, a color filter (also commonly referred to as a color resistance block) is arranged on the light-emergent side of the OLED display panel. Because the color filter filters light, the amount of ambient light emitted from the light-emitting surface after being reflected by the internal structure of the OLED display panel once entering the OLED display panel can be reduced. In addition, compared with the circular polarizer, the color filter has a higher transmittance for light emitted from the OLED display panel and a lower thickness of the OLED display panel integrated with the color filter, so that more and more OLED display panels are integrated with color filters.

Figure 1:
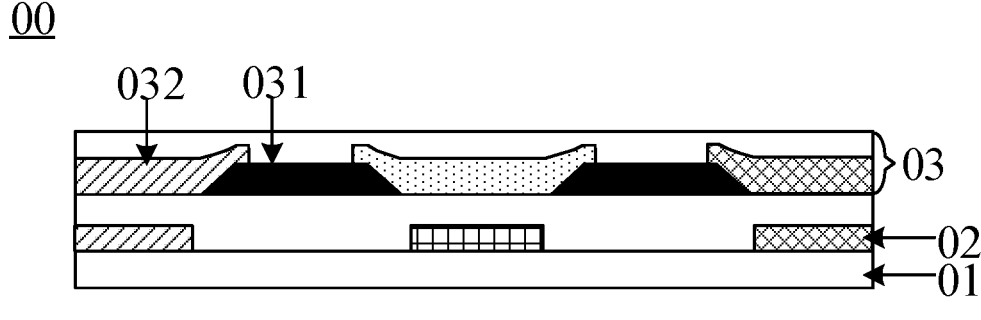
FIG. 1 is a schematic structural diagram of a display panel according to the related art.

In the related art, referring to FIG. 1, FIG. 1 is a schematic structural diagram of a display panel according to the related art. The display panel 00 includes a driver backplane 01, light-emitting devices 02, and a color film substrate 03.

A plurality of light-emitting devices 02 are disposed on one side of the driver backplane 01, and the plurality of light-emitting devices 02 are electrically connected to the driver backplane 01. In this way, the display panel controls the light-emitting devices 02 to emit light by the driver backplane 01.

The color film substrate 03 is provided with color resistance blocks 032 and a black matrix 031 disposed between any adjacent color resistance blocks 032. Wherein a plurality of color resistance blocks 032 are in one-to-one correspondence with the light-emitting devices 02. Thus, the light from the light-emitting devices 02 is emitted through the color resistance blocks 032 with different colors, such that the display panel 00 presents a color picture.

However, since the black matrix 031 also has a certain reflectance, and the area of the orthographic projection of the black matrix 031 onto the driver backplane 01 is usually large, the black matrix 031 reflects more ambient light out of the display panel 00 in the case that the ambient light irradiates the display panel 00, resulting in a higher reflectance of the display panel 00. For example, the reflectance of the display panel 00 is greater than 6%. Since the light intensity of the light reflected by the display panel 00 may cover the light intensity of the light emitted from the light-emitting devices 02 of the display panel 00 after the ambient light irradiate the display panel 00, in the case that the reflectance of the display panel 00 is relatively strong, the display effect of the display panel 00 is poor, and then the reliability of the display panel is low.

Figure 2:
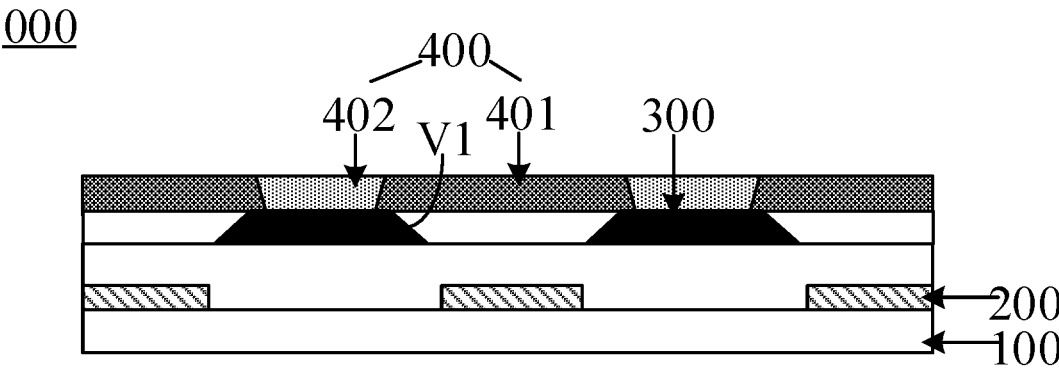
FIG. 2 is a schematic structural diagram of a display panel according to some embodiments of the present disclosure.

Referring to FIG. 2, FIG. 2 is a schematic structural diagram of a display panel according to some embodiments of the present disclosure. The display panel 000 includes a driver backplane 100, a plurality of light-emitting devices 200 disposed on a side of the driver backplane 100, a black matrix 300 disposed on a side, distal to the driver backplane 100, of the plurality of light-emitting devices 200 and a color resistance layer 400 disposed on a side, distal to the driver backplane 100, of the black matrix 300.

The black matrix 300 is provided with a plurality of first light-passing holes V1 in one-to-one correspondence with the plurality of light-emitting devices 200, and an orthographic projection of each light-emitting device 200 onto the driver backplane 100 falls within an orthographic projection of the first light-passing holes V1 corresponding to the light-emitting device 200 onto the driver backplane 100. Here, the driver backplane 100 is electrically connected to the light-emitting devices 200, and controls light emitted from the light-emitting devices 200. Thus, the light emitted from the light-emitting devices 200 is emitted from the corresponding first light-passing holes V1.

The color resistance layer 400 includes a plurality of color resistance blocks 401 in one-to-one correspondence with the plurality of first light-passing holes V1, and an auxiliary color resistance structure 402 disposed between any adjacent color resistance blocks 401. Here, the color resistance blocks 401 is composed of color resistance blocks 401 with a plurality of colors.

Wherein an orthographic projection of each first light-passing hole V1 onto the driver backplane 100 falls within an orthographic projection of the color resistance block 401 corresponding to the first light-passing hole V1 onto the driver backplane 100, and an orthographic projection of the auxiliary color resistance structure 402 onto the driver backplane 100 is at least partially overlapped with an orthographic projection of the black matrix 300 onto the driver backplane 100. Thus, the light emitted from the light-emitting devices 200 is emitted from the corresponding color resistance blocks 401, such that the display panel 000 displays color pictures.

In the present disclosure, due to the fact that the orthographic projection of the auxiliary color resistance structure 402 onto the driver backplane 100 is at least partially overlapped with the orthographic projection of the black matrix 300 onto the driver backplane 100, in the case that the ambient light irradiates the display panel 000, the ambient light irradiates the black matrix 300 after passing through the auxiliary color resistance structure 402, such that the intensity of the ambient light irradiating the black matrix 300 is reduced. That is, for the ambient light irradiating the black matrix 300 in the display panel 000, most of the light is absorbed by the auxiliary color resistance structure 402 in the process of passing through the auxiliary color resistance structure 402, and only a small portion of the light is reflected by the surface of the black matrix 300 out of the display panel 000. In this way, the reflectance of the display panel 000 is effectively reduced, such that the light intensity of the ambient light reflected by the display panel 000 does not cause a great interference to the light emitted from the light-emitting devices 200 of the display panel 000, thereby improving the reliability of the display panel 000.

In summary, the display panel according to the embodiments of the present disclosure includes a driver backplane, light-emitting devices, a black matrix, and a color resistance layer. wherein the color resistance layer is provided with color resistance blocks corresponding to the light-emitting devices and an auxiliary color resistance structure corresponding to the black matrix. Due to the fact that the orthographic projection of the auxiliary color resistance structure onto the driver backplane is at least partially overlapped with the orthographic projection of the black matrix onto the driver backplane, in the case that the ambient light irradiates the display panel, the ambient light irradiates the black matrix after passing through the auxiliary color resistance structure, such that the intensity of the ambient light irradiating the black matrix is reduced. That is, for the ambient light irradiating the black matrix in the display panel, most of the light is absorbed by the auxiliary color resistance structure in the process of passing through the auxiliary color resistance structure, and only a small portion of the light is reflected by the surface of the black matrix out of the display panel. In this way, the reflectance of the display panel is effectively reduced, such that the light intensity of the ambient light reflected by the display panel does not cause a great interference to the light emitted from the light-emitting devices of the display panel, thereby improving the reliability of the display panel.

Figure 3:
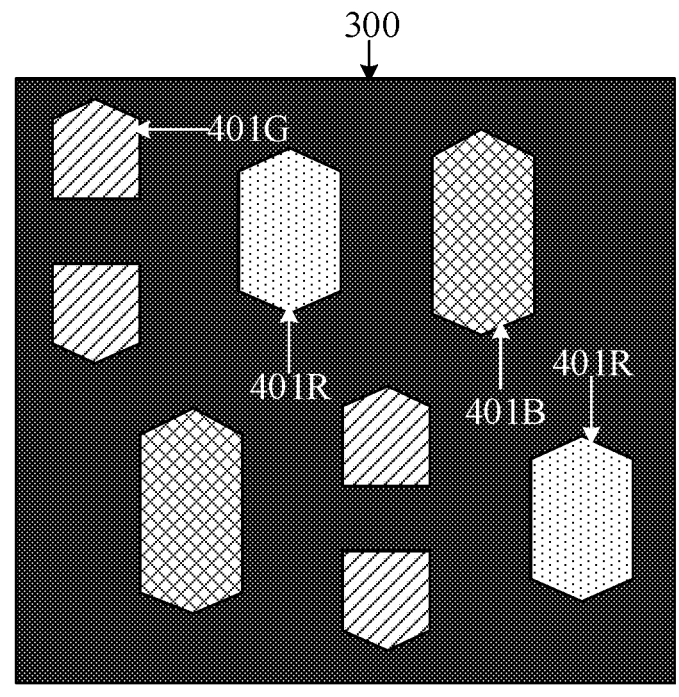
FIG. 3 is a top view of color resistance blocks and a black matrix according to some embodiments of the present disclosure.
Figure 4:
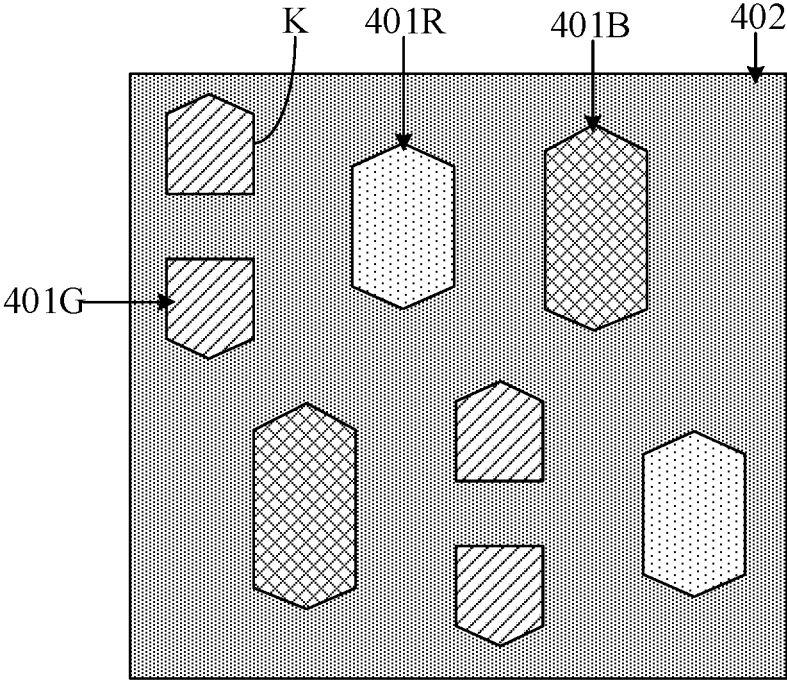
FIG. 4 is a top view of an auxiliary color resistance structure and color resistance blocks according to some embodiments of the present disclosure.

In the embodiments of the present disclosure, referring to FIG. 3 and FIG. 4, FIG. 3 is a top view of the color resistance blocks and black matrix according to some embodiments of the present disclosure, and FIG. 4 is a top view of the auxiliary color resistance structure and color resistance blocks according to some embodiments of the present disclosure. The auxiliary color resistance structure 402 in the color resistance layer 400 is provided with a plurality of opening areas K in one-to-one correspondence with the plurality of color resistance blocks 401, and a boundary of an orthographic projection of each opening area K onto the driver backplane 100 is in coincidence with a boundary of an orthographic projection of the color resistance block 401 corresponding to the opening area K onto the driver backplane 100. That is, the sidewalls of the color resistance blocks 401 are in contact with the sidewalls of the opening areas K in the auxiliary color resistance structure 402, so that it can be ensured that the area between any adjacent color resistance blocks 401 is filled with the auxiliary color resistance structure 402. In this way, in the ambient light irradiates the black matrix 300 after passing through the color resistance blocks 401 or passing through the auxiliary color resistance structure 402, such that the reflectance of the display panel 000 is further reduced.

In the present disclosure, the orthographic projection of the black matrix 300 onto the driver backplane 100 falls within the orthographic projection of the auxiliary color resistance structure 402 onto the driver backplane 100. In this way, the auxiliary color resistance structure 402 covers all of the black matrix 300 in the display panel 000. In this case, the orthographic projection of each color resistance block 401 onto the driver backplane 100 is in coincidence with the orthographic projection of the first light-passing hole V1 corresponding to the color resistance block 401 in the black matrix 300 onto the driver backplane 100.

In some embodiments, the plurality of color resistance blocks 401 in the color resistance layer 400 includes at least two types of color resistance blocks 401 with different colors, a color of the auxiliary color resistance structure 402 in the color resistance layer 400 is the same as a color of at least one type of color resistance blocks 401.

Figure 5:
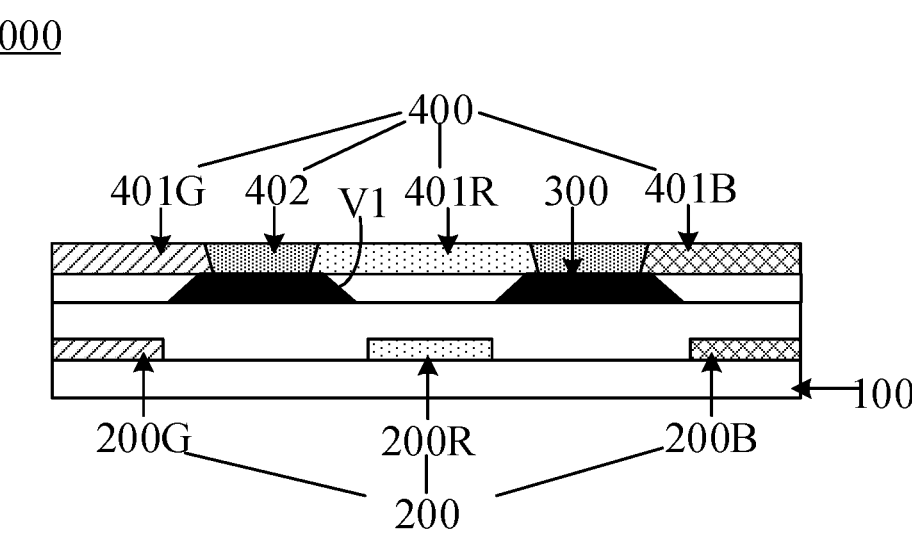
FIG. 5 is a schematic structural diagram of another display panel according to some embodiments of the present disclosure.

For example, as shown in FIG. 3 to FIG. 5, FIG. 5 is a schematic structural diagram of another display panel according to some embodiments of the present disclosure. The plurality of color resistance blocks 401 in the color resistance layer 400 includes red color resistance blocks 401R, green color resistance blocks 401G, and blue color resistance blocks 401B. The color of the auxiliary color resistance structure 402 in the color resistance layer 400 may be the same as the color of at least one of the red color resistance blocks 401R, the green color resistance blocks 401G, and the blue color resistance blocks 401B.

In the present disclosure, the color resistance blocks 401 with different colors are arranged in a certain arrangement manner in the display panel 000, such that the light emitted from each light-emitting device 200 passes through the corresponding color resistance blocks 401, and then the display panel 000 displays different color pictures. Here, the light-emitting devices 200 also includes a red light-emitting device 200R, a green light-emitting device 200G, and a blue light-emitting device 200B. The red light-emitting device 200R is in correspondence to the red color resistance block 401R, the green light-emitting device 200G is in correspondence to the green color resistance block 401G, and the blue light-emitting device 200B is in correspondence to the blue color resistance block 401B. That is, an orthographic projection of the red light-emitting device 200R onto the driver backplane 100 falls with an orthographic projection of the red color resistance block 401R onto the driver backplane 100; an orthographic projection of the green light-emitting device 200G onto the driver backplane 100 falls within an orthographic projection of the green color resistance block 401G onto the driver backplane 100; an orthographic projection of the blue light-emitting device 200B onto the driver backplane 100 is in correspondence to an orthographic projection of the blue color resistance block 401B onto the driver backplane 100.

In the embodiment of the present disclosure, there are multiple optional implementations for the color of the auxiliary color resistance structure 402 and the color of the color resistance blocks 401, and the embodiments of the present disclosure only take the following two optional implementations as examples for schematic description.

In the first optional implementation, the color of each portion in the auxiliary color resistance structure 402 is the same, and the color of the auxiliary color resistance structure 402 is any one of red, green, or blue. In this case, there are three cases for the structure of the auxiliary color resistance structure 402 and the color resistance blocks 401.

Figure 6:
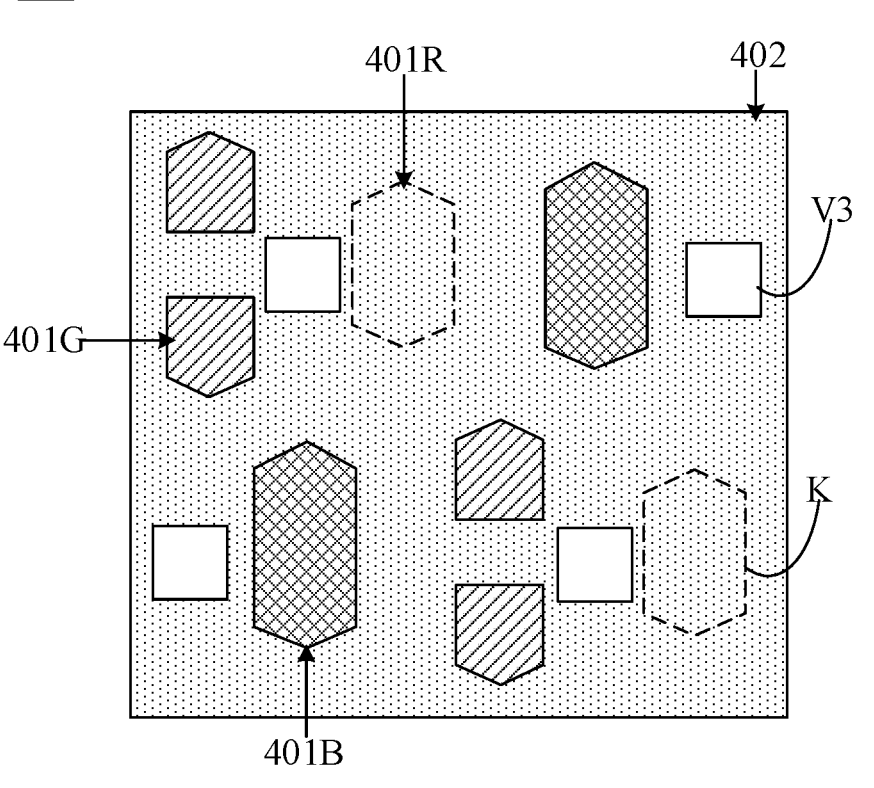
FIG. 6 is a top view of a color resistance layer according to some embodiments of the present disclosure.

In the first case, referring to FIG. 6, FIG. 6 is a top view of a color resistance layer according to some embodiments of the present disclosure. The color of the auxiliary color resistance structure 402 in the color resistance layer 400 is red. That is, the color of the auxiliary color resistance structure 402 in the color resistance layer 400 is the same as the color of the red color resistance blocks 401R.

Figure 7:
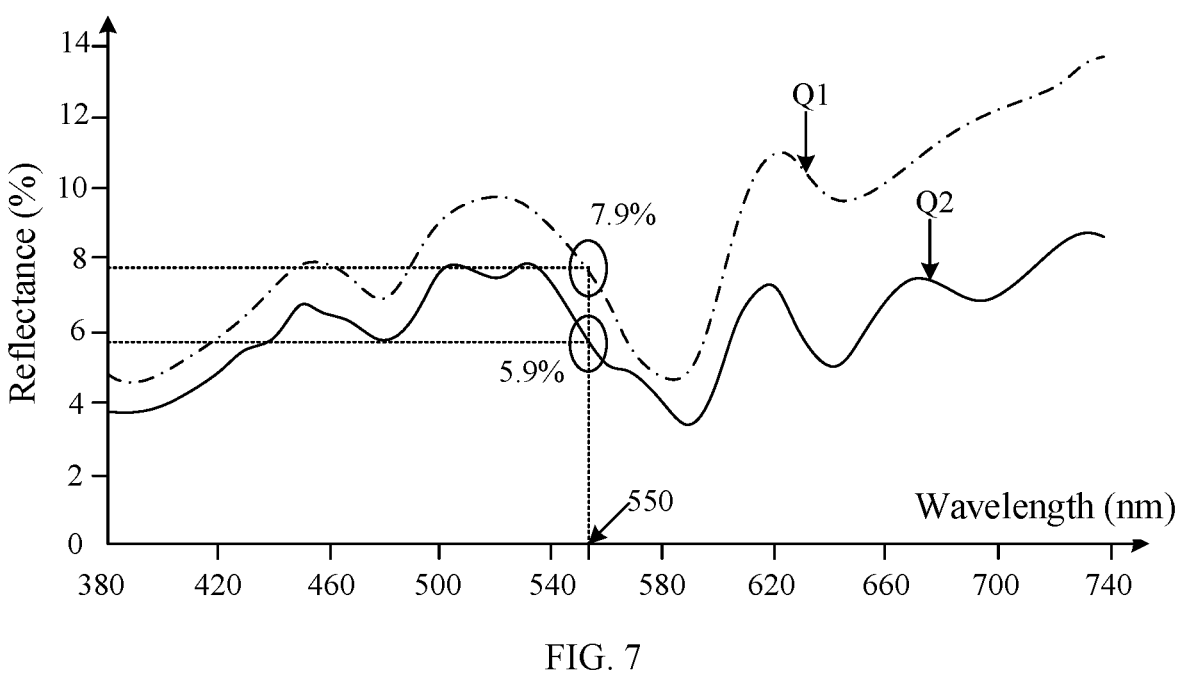
FIG. 7 is a graph showing a comparison between the reflectance of a display panel provided with the color resistance layer shown in FIG. 6 and a display panel not provided with the auxiliary color resistance structure.

In the present disclosure, for a clearer description, the reflectance of the display panel 000 provided with the auxiliary color resistance structure 402 which is set to red is compared with the reflectance of the display panel not provided with the auxiliary color resistance structure 402. Referring to FIG. 7, FIG. 7 is a graph showing a comparison between the reflectance of a display panel provided with the color resistance layer shown in FIG. 6 and the reflectance of a display panel not provided with the auxiliary color resistance structure. Here, the reflectance curve of the display panel not provided with the auxiliary color resistance structure is denoted as Q1, and the reflectance curve of the display panel provided with the color resistance layer shown in FIG. 6 is denoted as Q2. As can be seen from the figure, the reflectance of the display panel 000 provided with the auxiliary color resistance structure 402 which is set to red is significantly reduced in a visible wavelength range compared with the reflectance of the display panel not provided with the auxiliary color resistance structure. For example, for light with a wavelength of 550 nm, the reflectance of the display panel not provided with the auxiliary color resistance structure is 7.9%, and the reflectance of the display panel 000 provided with the auxiliary color resistance structure 402 which is set to red is only 5.9%. Thus, after the auxiliary color resistance structure 402 of the display panel 000 is all set to red, the reflectance of the display panel 000 is reduced by 12%. In this way, by setting all the auxiliary color resistance structure 402 to red, the reflectance of the display panel 000 is effectively reduced.

Figure 8:
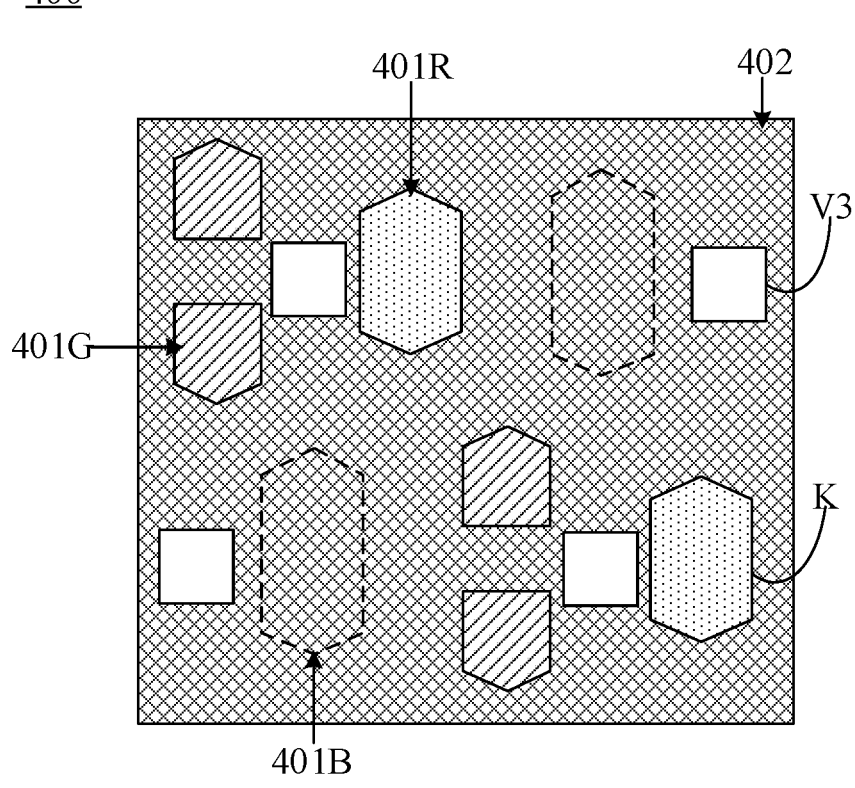
FIG. 8 is a top view of another color resistance layer according to some embodiments of the present disclosure.

In the second case, referring to FIG. 8, FIG. 8 is a top view of another color resistance layer according to some embodiments of the present disclosure. The color of the auxiliary color resistance structure 402 in the color resistance layer 400 is blue. That is, the color of the auxiliary color resistance structure 402 in the color resistance layer 400 is the same as the color of the blue color resistance blocks 401B.

Figure 9:
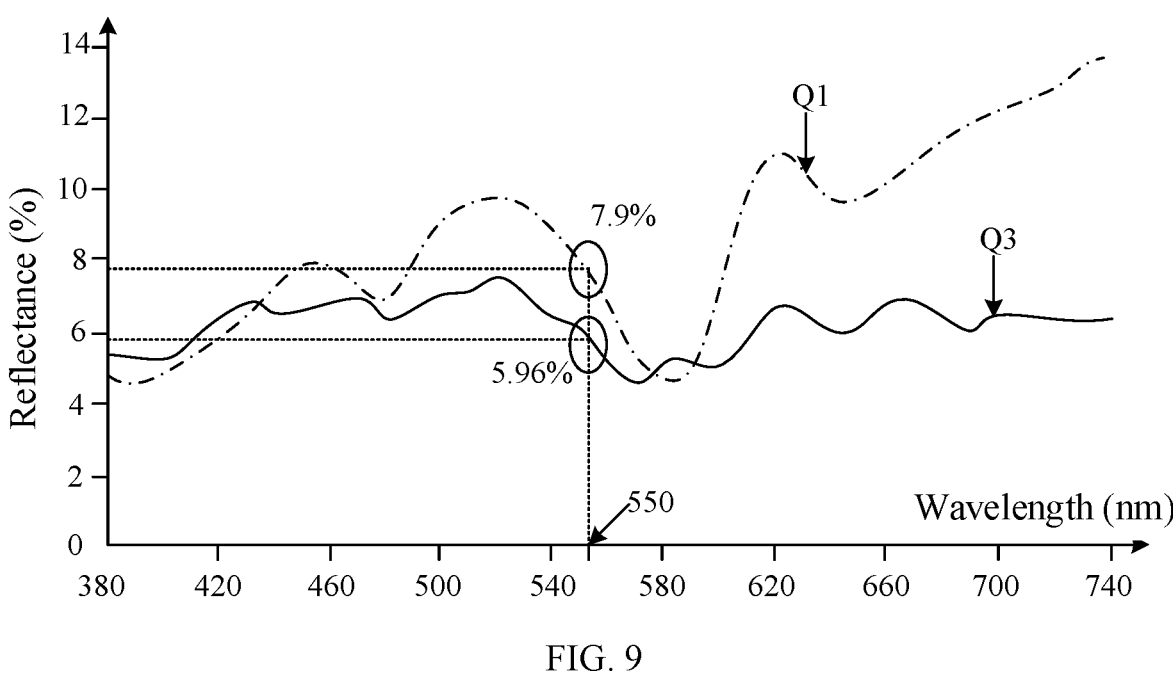
FIG. 9 is a graph showing a comparison between the reflectance of a display panel provided with the color resistance layer shown in FIG. 8 and a display panel not provided with the auxiliary color resistance structure.

In the present disclosure, for a clearer description, the reflectance of the display panel 000 provided with the auxiliary color resistance structure 402 which is set to blue is compared with the reflectance of the display panel not provided with the auxiliary color resistance structure 402. Referring to FIG. 9, FIG. 9 is a graph showing a comparison between the reflectance of a display panel provided with the color resistance layer shown in FIG. 8 and the reflectance of a display panel not provided with the auxiliary color resistance structure. Here, the reflectance curve of the display panel not provided with the auxiliary color resistance structure 402 is denoted as Q1, and the reflectance curve of the display panel provided with the color resistance layer shown in FIG. 8 is denoted as Q3. As can be seen from the figure, the reflectance of the display panel 000 provided with the auxiliary color resistance structure 402 which is set to blue is significantly reduced in a visible wavelength range compared with the reflectance of the display panel not provided with the auxiliary color resistance structure. For example, for light with a wavelength of 550 nm, the reflectance of the display panel not provided with the auxiliary color resistance structure 402 is 7.9%, and the reflectance of the display panel 000 provided with the auxiliary color resistance structure 402 which is set to red is only 6.0%. Thus, after the auxiliary color resistance structure 402 of the display panel 000 is all set to blue, the reflectance of the display panel 000 is reduced by 14%. In this way, by setting all the auxiliary color resistance structure 402 to blue, the reflectance of the display panel 000 is effectively reduced.

Figure 10:
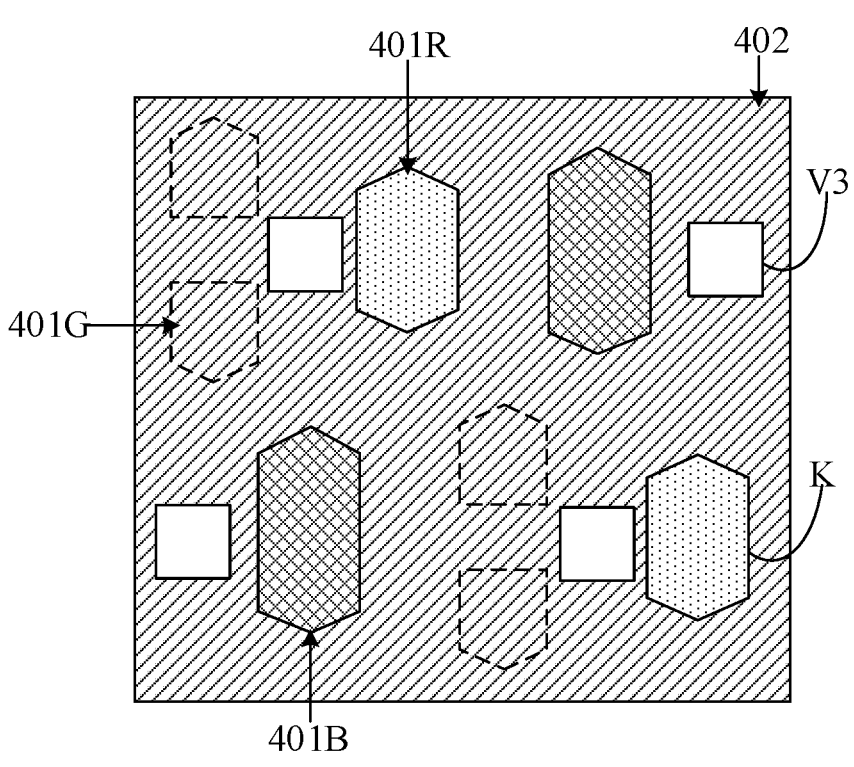
FIG. 10 is a top view of yet another color resistance layer according to some embodiments of the present disclosure.

In the third case, referring to FIG. 10, FIG. 10 is a top view of yet another color resistance layer according to some embodiments of the present disclosure. The color of the auxiliary color resistance structure 402 in the color resistance layer 400 is green. That is, the color of the auxiliary color resistance structure 402 in the color resistance layer 400 is the same as the color of the green color resistance blocks 401G.

Figure 11:
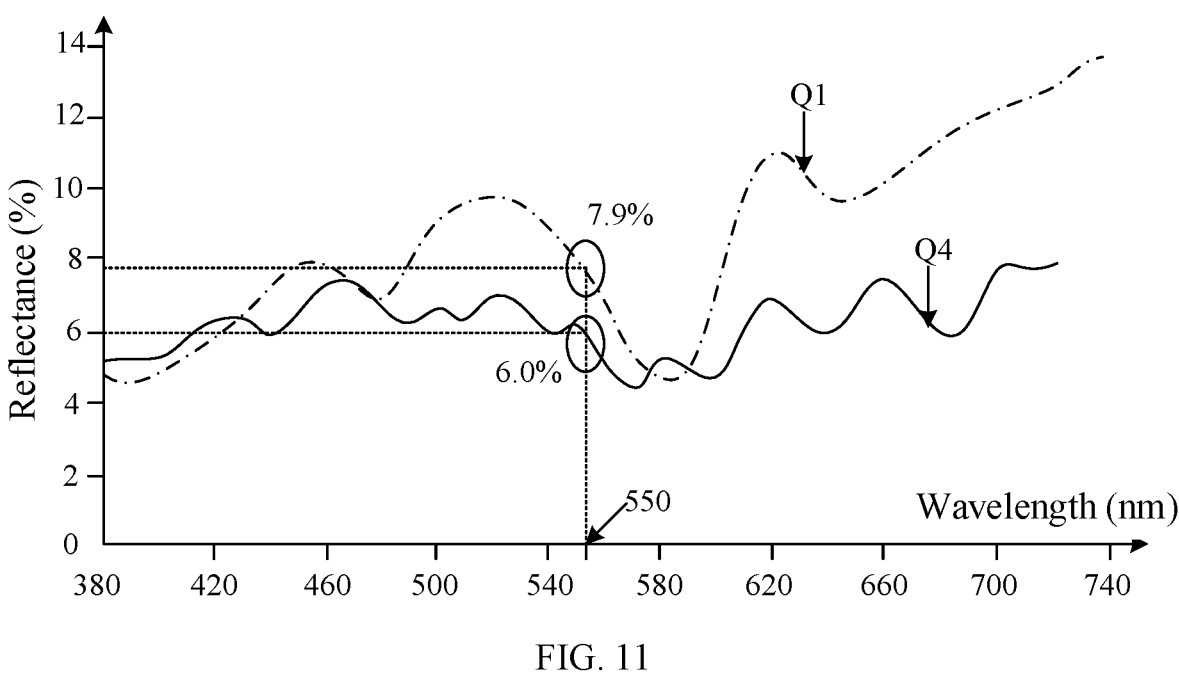
FIG. 11 is a graph showing a comparison between the reflectance of a display panel provided with the color resistance layer shown in FIG. 10 and a display panel not provided with the auxiliary color resistance structure.

In the present disclosure, for a clearer description, the reflectance of the display panel 000 provided with the auxiliary color resistance structure 402 which is set to green is compared with the reflectance of the display panel not provided with the auxiliary color resistance structure 402. Referring to FIG. 11, FIG. 11 is a graph showing a comparison between the reflectance of a display panel provided with the color resistance layer shown in FIG. 10 and the reflectance of a display panel not provided with the auxiliary color resistance structure. Here, the reflectance curve of the display panel not provided with the auxiliary color resistance structure 402 is denoted as Q1, and the reflectance curve of the display panel provided with the color resistance layer shown in FIG. 10 is denoted as Q4. As can be seen from the figure, the reflectance of the display panel 000 provided with the auxiliary color resistance structure 402 which is set to green is significantly reduced in a visible wavelength range compared with the reflectance of the display panel not provided with the auxiliary color resistance structure. For example, for light with a wavelength of 550 nm, the reflectance of the display panel not provided with the auxiliary color resistance structure 402 is 7.9%, and the reflectance of the display panel 000 provided with the auxiliary color resistance structure 402 which is set to green is only 5.96%. Thus, after the auxiliary color resistance structure 402 of the display panel 000 is all set to green, the reflectance of the display panel 000 is reduced by 9%. In this way, by setting all the auxiliary color resistance structure 402 to green, the reflectance of the display panel 000 is effectively reduced.

Figure 12:
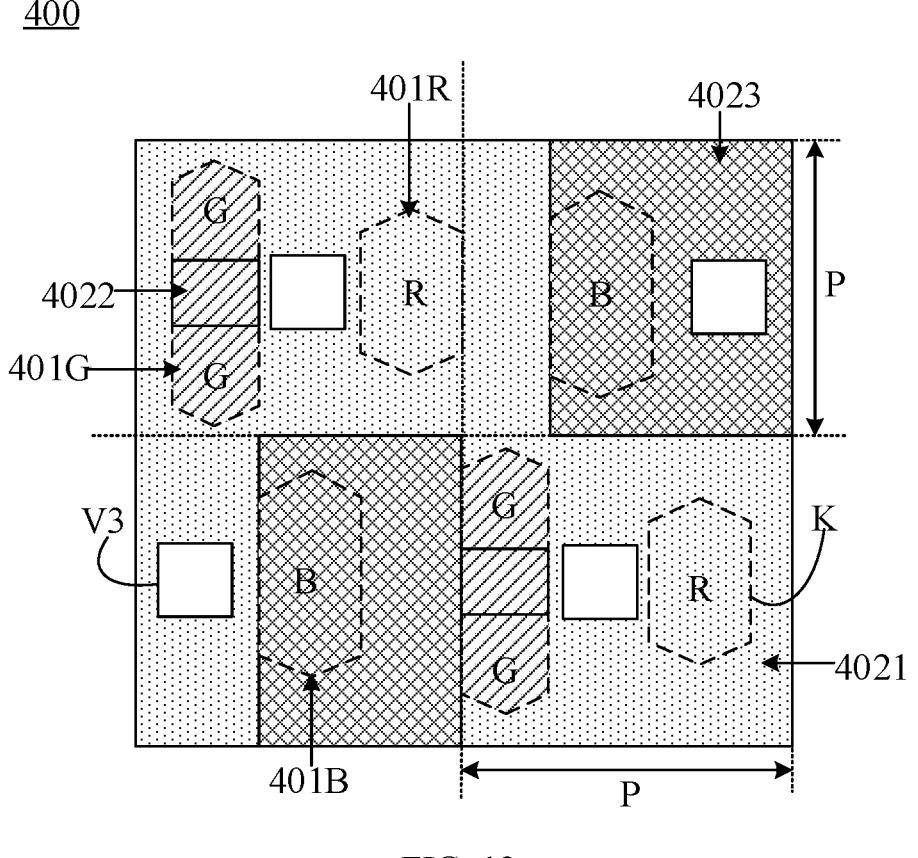
FIG. 12 is a top view of a color resistance layer according to some embodiments of the present disclosure.

In the second optional implementation, referring to FIG. 12, FIG. 12 is a top view of another color resistance layer according to some embodiments of the present disclosure. The auxiliary color resistance structure 402 in the color resistance layer 400 includes at least two of a first portion 4021, a second portion 4022, and a third portion 4023, wherein the color of the first portion 4021 is the same as the color of the red color resistance block 401R, the color of the second portion 4022 is the same as the color of the green color resistance block 401G, and the color of the third portion 4023 is the same as the color of the blue color resistance block 401B. In this case, the auxiliary color resistance structure 402 is composed of at least two colors of color resistance blocks.

In the case that the auxiliary color resistance structure 402 includes a first portion 4021, the first portion 4021 is at least distributed on a side of the red color resistance block 401R. Here, the first portion 4021 is disposed on one side of the red color resistance block 401R, or is disposed around the red color resistance block 401R, which is not limited in the embodiments of the present disclosure. For example, FIG. 12 takes the case where the first portion 4021 is disposed around the red color resistance block 401R as an example for description. In this case, since the first portion 4021 of red color is at least distributed on one side of the red color resistance block 401R, the area of the red area in the color resistance layer 400 increases. Thus, in the process of manufacturing the patterned red color resistance structure (which includes the red color resistance block 401R and the first portion 4021) by using a mask, the area of the opening area of the mask corresponding to the patterned red color resistance structure is relatively large, that is, the precision of the mask as required is low. In this way, the process difficulty for manufacturing the patterned red color resistance structure is effectively reduced, and then the manufacturing efficiency of the display panel 000 is effectively improved.

In the case that the auxiliary color resistance structure 402 includes a second portion 4022, the second portion 4022 is at least distributed on a side of the green color resistance block 401G. Here, the second portion 4022 is disposed on one side of the green color resistance block 401G, or is disposed around the green color resistance block 401G, which is not limited in the embodiments of the present disclosure. For example, FIG. 12 takes the case where the second portion 4022 is disposed on one side of the green color resistance block 401G as an example for description. In this case, since the second portion 4022 of green color is at least distributed on one side of the green color resistance block 401G, the area of the green area in the color resistance layer 400 increases. Thus, in the process of manufacturing the patterned green color resistance structure (which includes the green color resistance block 401G and the second portion 4022) by using a mask, the area of the opening area of the mask corresponding to the patterned green color resistance structure is relatively large, that is, the precision of the mask as required is low. In this way, the process difficulty for manufacturing the patterned green color resistance structure is effectively reduced, and then the manufacturing efficiency of the display panel 000 is effectively improved.

In the case that the auxiliary color resistance structure 402 includes a third portion 4023, the third portion 4023 is at least distributed on a side of the blue color resistance block 401B. Here, the third portion 4023 is disposed on one side of the blue color resistance block 401B, or is disposed around the blue color resistance block 401B, which is not limited in the embodiments of the present disclosure. For example, FIG. 12 takes the case where the third portions 4023 are disposed on a plurality of sides of the blue color resistance block 401B connected in series as an example for description. In this case, since the third portion 4023 of blue color is at least distributed on one side of blue color resistance block 401B, the area of the blue area in the color resistance layer 400 increases. Thus, in the process of manufacturing the patterned blue color resistance structure (which includes the blue color resistance block 401B and the third portion 4023) by using a mask, the area of the opening area of the mask corresponding to the patterned blue color resistance structure is large, that is, the precision of the mask as required is low. In this way, the process difficulty for manufacturing the patterned blue color resistance structure is effectively reduced, and then the manufacturing efficiency of the display panel 000 is effectively improved.

In the embodiment of the present disclosure, in the case that the auxiliary color resistance structure 402 includes a first portion 4021, a second portion 4022, and a third portion 4023 at the same time, an area $S_B$ of an orthographic projection of the third portion 4023 onto the driver backplane 100 is smaller than an area $S_R$ of an orthographic projection of the first portion 4021 onto the driver backplane 100, and is larger than an area $S_G$ of an orthographic projection of the second portion 4022 onto the driver backplane 100. Here, as can be seen from the disclosures of the first optional implementation, the reflectance of the display panel 000 with all of the auxiliary color resistance structure 402 in the display panel 000 being set to red is almost the same as the reflectance of the display panel with all of the auxiliary color resistance structure 402 in the display panel 000 being set to blue. Moreover, since more blue light is reflected by the display panel 000, which may cause an adverse effect on the eyes of users, the area $S_B$ of the orthographic projection of the third portion 4023 in the auxiliary color resistance structure 402 onto the driver backplane 100 is smaller than the area $S_R$ of the orthographic projection of the first portion 4021 onto the driver backplane 100. Meanwhile, since the auxiliary color resistance structure 402 of the display panel 000 is all set to green, the reflectance of the display panel 000 is relatively large, and human eyes are sensitive to green light, the area $S_G$ of the orthographic projection of the second portion 4022 in the auxiliary color resistance structure 402 onto the driver backplane 100 is smaller than the area $S_B$ of the orthographic projection of the third portion 4023 onto the driver backplane 100. In this way, on the premise of ensuring that the reflectance of the display panel 000 is relatively low, the effect of the user viewing the picture displayed by the display panel 000 is improved as much as possible.

In the present disclosure, since the arrangement of the light-emitting devices 200 in the display panel 000 is different, the arrangement of the color resistance blocks 401 and the auxiliary color resistance structure 402 in the color resistance layer 400 is also different; and the embodiments of the present disclosure only take the following three arrangements as examples for schematic description.

In the first arrangement, in the case that the color resistance blocks 401 are arranged as shown in FIG. 12, in the longitudinal arrangement direction, a first column of four color resistance blocks 401 (401G, 401G, 401R, and 401B) constitutes one pixel in the display panel 000, and a second column of four color resistance blocks 401 (401B, 401G, 401G, and 401R) constitutes one pixel in the display panel 000; in the horizontal arrangement direction, a first row of four color resistance blocks 401 constitutes one pixel in the display panel 000, and a second row of four color resistance blocks 401 also constitutes one pixel in the display panel 000. Here, the four pixels have a color resistance block 401 in common, and the four pixels constitute one square.

In this case, the area of all of the auxiliary color resistance structure 402 in the display panel 000 is calculated for convenience. The side length of the square composed of the four pixels is denoted as 2P. P is the distance between adjacent Pixels, which may be obtained according to the pixels per inch (PPI) of the display panel 000. Thus, the area $S_R$ of the orthographic projection of the first portion 4021 in the auxiliary color resistance structure 402 onto the driver backplane 100 meets the following relationship:

$$2*P^\wedge 2 < S_R \le 4*P^\wedge 2.$$

The area $S_G$ of the orthographic projection of the second portion 4022 in the auxiliary color resistance structure 402 onto the driver backplane 100 meets the following relationship:

$$0 < S_G \le 0.4*P^\wedge 2.$$

The area $S_B$ of the orthographic projection of the third portion 4023 in the auxiliary color resistance structure 402 onto the driver backplane 100 meets the following relationship:

$$0.4*P^\wedge 2 < S_B \le 2*P^\wedge 2.$$

Figure 13:
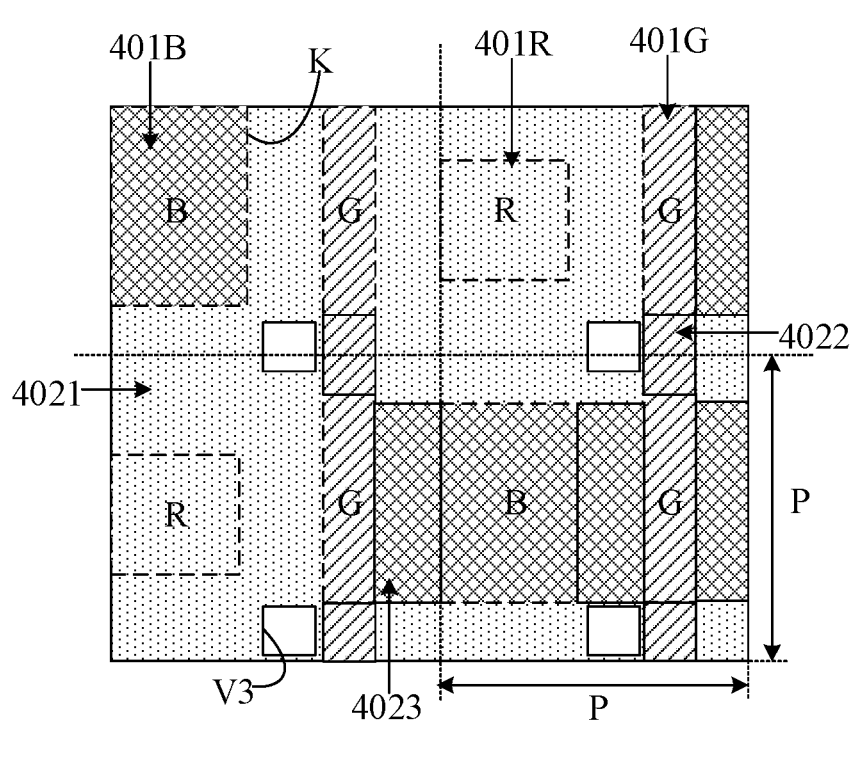
FIG. 13 is a top view of another color resistance layer according to some embodiments of the present disclosure.

For the second arrangement, referring to FIG. 13, FIG. 13 is a top view of another color resistance layer according to some embodiments of the present disclosure. In the case that the color resistance blocks 401 are arranged as shown in FIG. 13, in the longitudinal arrangement direction, a first column of four color resistance blocks 401 (401B, 401G, 401R, and 401G) constitutes one pixel in the display panel 000, and a second column of four color resistance blocks 401 (401R, 401G, 401B, and 401G) also constitutes one pixel in the display panel 000; in the horizontal arrangement direction, a first row of four color resistance blocks 401 constitutes one pixel in the display panel 000, and a second row of four color resistance structures 401 also constitutes one pixel in the display panel 000. Here, the four pixels have a color resistance block 401 in common, and the four pixels constitute one square.

In this case, the area of all of the auxiliary color resistance structure 402 in the display panel 000 is calculated for convenience. The side length of the square composed of the four pixels is denoted as 2P. P is the distance between adjacent Pixels, which may be obtained according to the pixels per inch (PPI) of the display panel 000. Thus, the area $S_R$ of the orthographic projection of the first portion 4021 in the auxiliary color resistance structure 402 onto the driver backplane 100 meets the following relationship:

$$2*P^\wedge 2 < S_R \le 4*P^\wedge 2.$$

The area $S_G$ of the orthographic projection of the second portion 4022 in the auxiliary color resistance structure 402 onto the driver backplane 100 meets the following relationship:

$$0 < S_G \le 0.4*P^\wedge 2.$$

The area $S_B$ of the orthographic projection of the third portion 4023 in the auxiliary color resistance structure 402 onto the driver backplane 100 meets the following relationship:

$$0.4 * P^\wedge 2 < S_B \leq 2 * P^\wedge 2.$$

Figure 14:
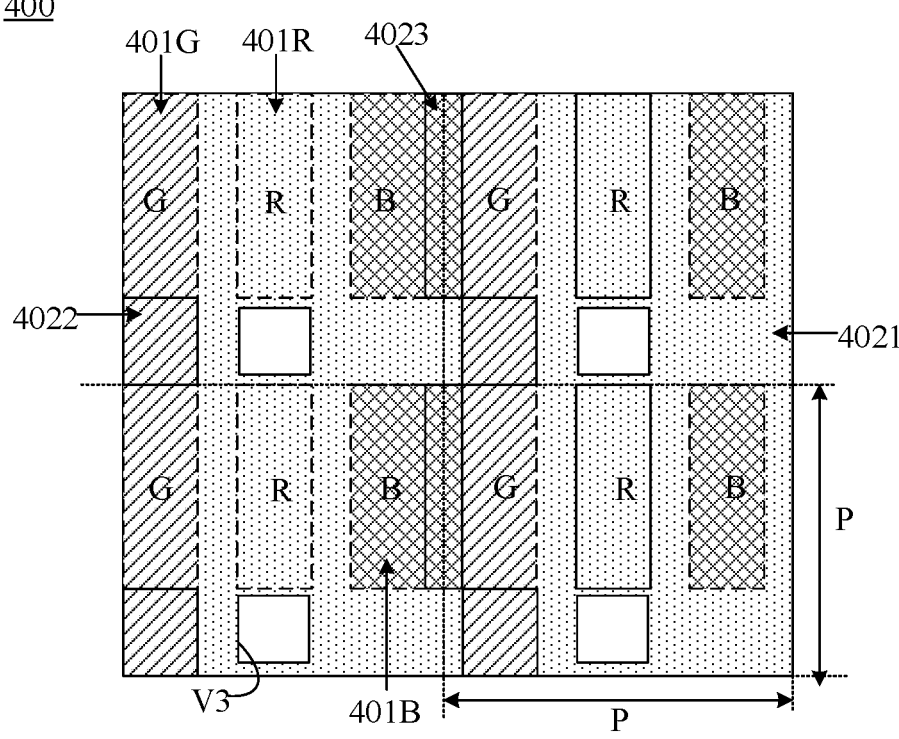
FIG. 14 is a top view of yet another color resistance layer according to some embodiments of the present disclosure.

In the third arrangement, referring to FIG. 14, FIG. 14 is a top view of yet another color resistance layer according to some embodiments of the present disclosure. In the case that the color resistance blocks 401 are arranged as shown in FIG. 14, in the horizontal arrangement direction, a first row of six color resistance structures 401 constitutes two pixels in the display panel 000, and a second row of six color resistance structures 401 also constitutes two pixels in the display panel 000; in the longitudinal arrangement direction, a first column of six color resistance structures 401 constitutes two pixels in the display panel 000, and a second column of six color resistance structures 401y also constitutes two pixels in the display panel 000. Here, the four pixels have no color resistance block 401 in common, and the four pixels constitute one square.

In this case, the area of all of the auxiliary color resistance structure 402 in the display panel 000 is calculated for convenience. The side length of the square composed of the four pixels is denoted as 2P. P is the distance between adjacent Pixels, which may be obtained according to the pixels per inch (PPI) of the display panel 000. Thus, the area $S_R$ of the orthographic projection of the first portion 4021 in the auxiliary color resistance structure 402 onto the driver backplane 100 meets the following relationship:

$$2 * P^\wedge 2 < S_R \leq 4 * P^\wedge 2.$$

The area $S_G$ of the orthographic projection of the second portion 4022 in the auxiliary color resistance structure 402 onto the driver backplane 100 meets the following relationship:

$$0 < S_G \leq 0.4 * P^\wedge 2.$$

The area $S_B$ of the orthographic projection of the third portion 4023 in the auxiliary color resistance structure 402 onto the driver backplane 100 meets the following relationship:

$$0.4 * P^\wedge 2 < S_B \leq 2 * P^\wedge 2.$$

It should be noted that, in the above several arrangements, the distance P between adjacent pixels ranges from 1 to 100 microns.

Figure 15:
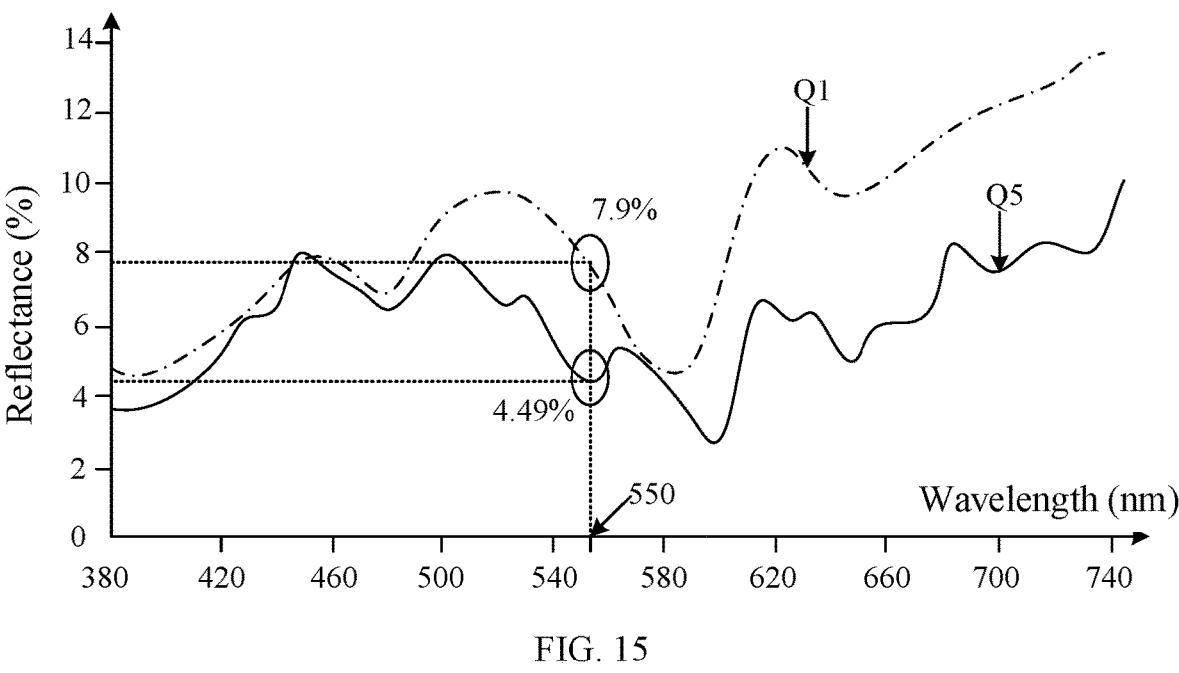
FIG. 15 is a graph showing a comparison between the reflectance of a display panel provided with the color resistance layer shown in FIG. 14 and the reflectance of a display panel not provided with the auxiliary color resistance structure.

In the present disclosure, for a clearer description, the reflectance of the display panel 000 provided with the auxiliary color resistance structure 402 which is set to three portions is compared with the reflectance of the display panel not provided with the auxiliary color resistance structure. Referring to FIG. 15, FIG. 15 is a graph showing a comparison between the reflectance of a display panel provided with the color resistance layer shown in FIG. 14 and the reflectance of a display panel not provided with the auxiliary color resistance structure. Here, the reflectance curve of the display panel not provided with the auxiliary color resistance structure 402 is denoted as Q1, and the reflectance curve of the display panel provided with the color resistance layer shown in FIG. 14 is denoted as Q5. As can be seen from the figure, the reflectance of the display panel provided with the auxiliary color resistance structure which is set to three portions is significantly reduced in a visible wavelength range compared with the reflectance of the display panel not provided with the auxiliary color resistance structure. For example, for light with a wavelength of 550 nm, the reflectance of the display panel not provided with the auxiliary color resistance structure 402 is 7.9%, and the reflectance of the display panel provided with the auxiliary color resistance structure which is set to three portions is only 4.49%. Thus, after the auxiliary color resistance structure is set to three portions, the reflectance of the display panel 000 is reduced by 21%. In this way, by setting the auxiliary color resistance structure 402 to three portions, the reflectance of the display panel 000 is effectively reduced.

It should be noted that, all of the above embodiments take the case where the auxiliary color resistance structure 402 includes a first portion 4021, a second portion 4022, and a third portion 4023 as an example for schematic description. In other possible implementations, the auxiliary color resistance structure 402 may also only include two of the first portion 4021, the second portion 4022, and the third portion 4023.

Figure 16:
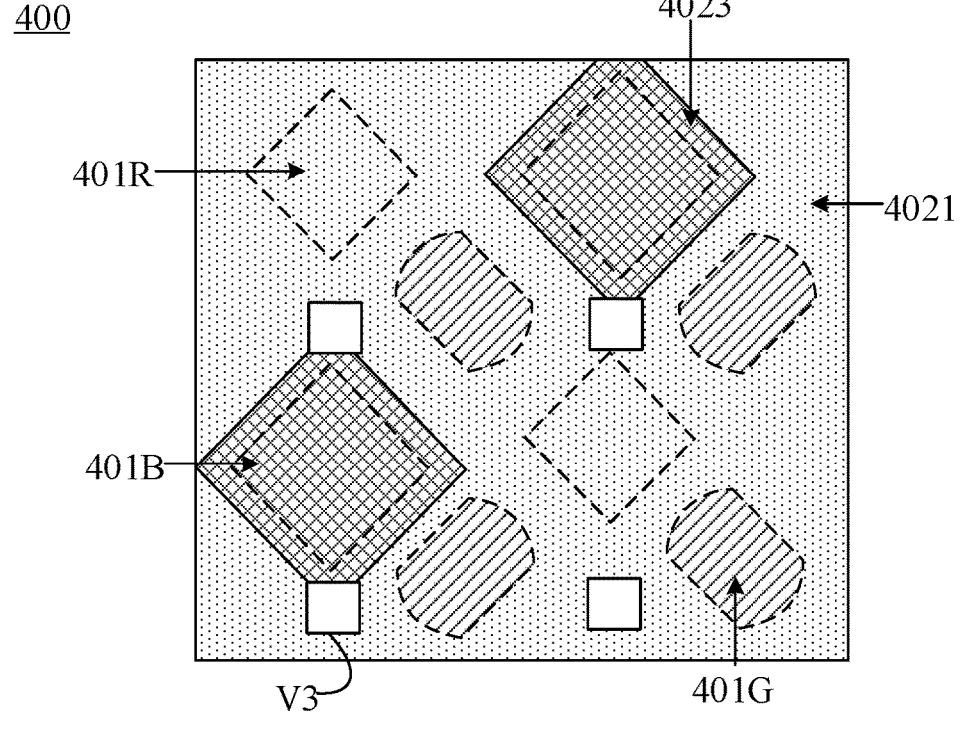
FIG. 16 is a top view of a color resistance layer in the case that an auxiliary color resistance structure includes two portions according to some embodiments of the present disclosure.
Figure 17:
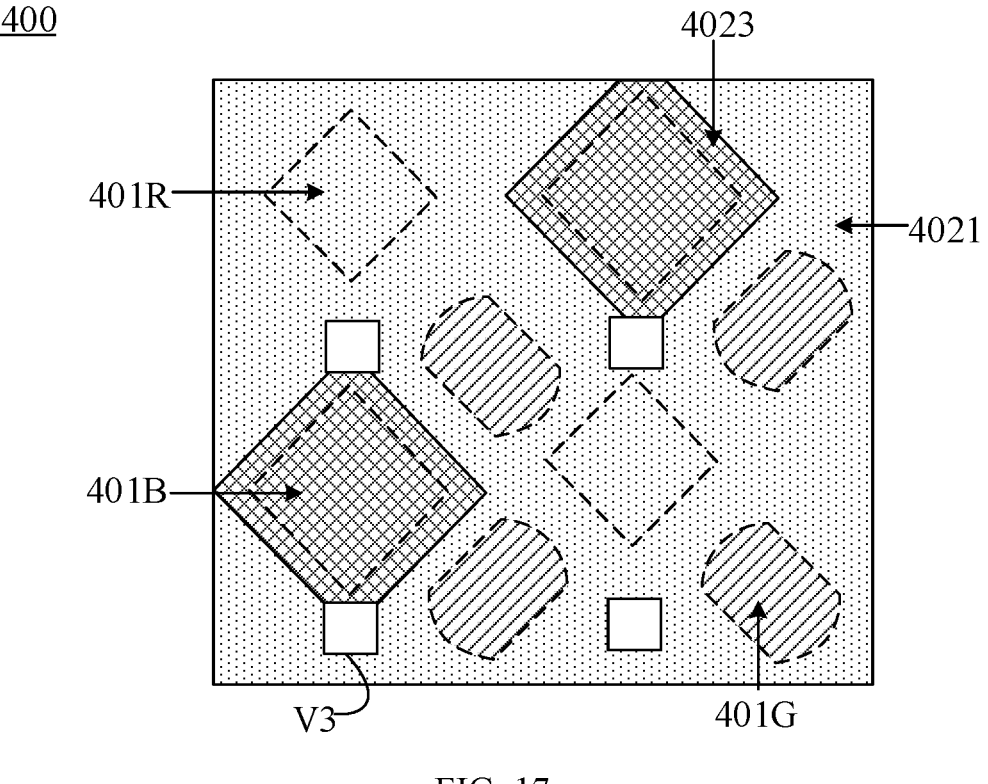
FIG. 17 is a top view of a color resistance layer in the case that another auxiliary color resistance structure includes two portions according to some embodiments of the present disclosure.

For example, referring to FIG. 16, FIG. 16 is a top view of a color resistance layer in the case that an auxiliary color resistance structure includes two portions according to some embodiments of the present disclosure. In the case that the auxiliary color resistance structure 402 includes two of the first portion 4021, the second portion 4022, and the third portion 4023 at the same time, the area of the orthographic projections of the two portions in the auxiliary color resistance structure 402 onto the driver backplane 100 may also refer to the relationship between the area $S_R$ of the first portion 4021, the area $S_G$ of the second portion 4022 and the area $S_B$ of the third portion 4023 in the above embodiments, which is not repeated in the embodiment of the present disclosure. It should be noted that, in the case that the auxiliary color resistance structure 402 includes two of the first portion 4021, the second portion 4022, and the third portion 4023 at the same time, the color resistance blocks 401 and the auxiliary color resistance structure 402 in the color resistance layer 400 are arranged differently. In one case, as shown in FIG. 16, in the case that the color resistance blocks 401 are arranged as shown in FIG. 16, the auxiliary color resistance structure 402 includes both the first portion 4021 and the third portion 4023, wherein the third portion 4023 is disposed around the blue color resistance block 401B. Here, the arrangement of the color resistance blocks 401 as shown in FIG. 16 is a diamond-type arrangement. In another case, referring to FIG. 17, FIG. 17 is a top view of a color resistance layer in the case that another auxiliary color resistance structure includes two portions according to some embodiments of the present disclosure. The auxiliary color resistance structure 402 also includes both the first portion 4021 and the third portion 4023. In contrast, the arrangement of the color resistance blocks 401 as shown in FIG. 17 is a tripod-type arrangement.

It should be noted that, in both of the above cases, the area $S_R$ of the orthographic projection of the first portion 4021 onto the driver backplane 100 meets the relationship in the above embodiments; the area $S_B$ of the orthographic projection of the third portion 4023 onto the driver backplane 100 also meets the relationship in the above embodiments, which is not repeated in the embodiments of the present disclosure.

It should be further noted that, in both of the above optional implementations, the auxiliary color resistance structure 402 is made of the same material as the color resistance block 401, and in other possible implementations, the auxiliary color resistance structure 402 may also be made of other materials capable of reducing the reflectance, which is not limited in the embodiments of the present disclosure.

In the related art, in the display panel 00 shown in FIG. 1, in the process of manufacturing the color film substrate 03, a patterned black matrix 031 is firstly generated, and the black matrix 031 has a certain thickness. Therefore, in the case that the color resistance block 031 is subsequently generated on the black matrix 031, portions of the color resistance block 031 are disposed in the recess structure formed by the black matrix 031. Thus, the side, distal to the driver backplane 01, of the color resistance block 031 is also partially recessed. In this way, in the case that the ambient light irradiates the display panel 00 in a black screen state, the ambient light reflected by the internal structure of the display panel 00 is very prone to exhibit a color phenomenon (i.e., a color separation phenomenon), for example, the color separation value of the display panel is 23. Thus, the color separation of the display panel 00 is relatively large, resulting in a poor display effect of the display panel.

Figure 18:
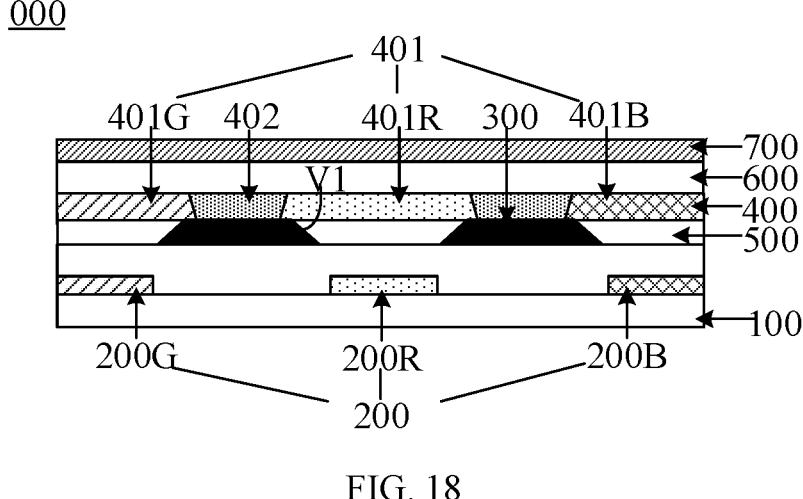
FIG. 18 is a schematic structural diagram of yet another display panel according to some embodiments of the present disclosure.

In the embodiments of the present disclosure, referring to FIG. 18, FIG. 18 is a schematic structural diagram of yet another display panel according to some embodiments of the present disclosure. The display panel 000 further includes a first cover layer 500 disposed between the black matrix 300 and the color resistance layer 400, a thickness of the first cover layer 500 is greater than or equal to a thickness of the black matrix 300. Here, at least a portion of the first cover layer 500 is disposed in the first light-passing holes V1 of the black matrix 300. Thus, in the process of forming the display panel 000, the first cover layer 500 is manufactured on the black matrix 300 based on the black matrix 300 being provided with a plurality of first light-passing holes V1, such that the first cover layer 500 planarizes the first light-passing holes V1 in the black matrix 300, so as to planarize the side, distal to the driver backplane 100, of the color resistance block 401 in the color resistance layer 400, which is subsequently manufactured on the first cover layer 500. In this way, in the case that the ambient light irradiates the display panel in a black screen state, the ambient light reflected by the internal structure of the display panel is not prone to exhibit a color phenomenon, for example, the color separation value of the display panel 000 is 11. Thus, the color separation of the display panel 000 is effectively reduced, such that the display effect of the display panel 000 is relatively good.

It should be noted that, the thickness of the first cover layer 500 is greater than or equal to the thickness of the black matrix 300, such that the first cover layer 500 planarizes the first light-passing holes V1 in the black matrix 300. For example, when the thickness of the black matrix 300 is 1.5 μm, the thickness of the first cover layer 500 ranges from 1.5 microns to 2 microns. It should be further noted that, in the present disclosure, the planarization on the black matrix 300 provided with a plurality of first light-passing holes V1 by the first cover layer 500 may use a chemical vapor deposition method or a method for planarizing an organic material, which is not limited in the embodiments of the present disclosure.

In the embodiment of the present disclosure, as shown in FIG. 18, the display panel 000 further includes a second cover layer 600 disposed on a side, distal to the driver backplane 100, of the color resistance layer 400, and an inorganic cover layer 700 disposed on a side, distal to the driver backplane 100, of the second cover layer 600, a refractive index of the inorganic cover layer 700 is greater than a refractive index of the second cover layer 600. Here, since the refractive index of the inorganic cover layer 700 is greater than the refractive index of the second cover layer 600, when the ambient light irradiates the display panel, total reflection may occur at the interface between the second cover layer 600 and the inorganic cover layer 700 after the ambient light passes through the inorganic cover layer 700, such that the light emitted from the inorganic cover layer 700 is less, and then the reflectance of the display panel 000 is reduced.

Figure 19:
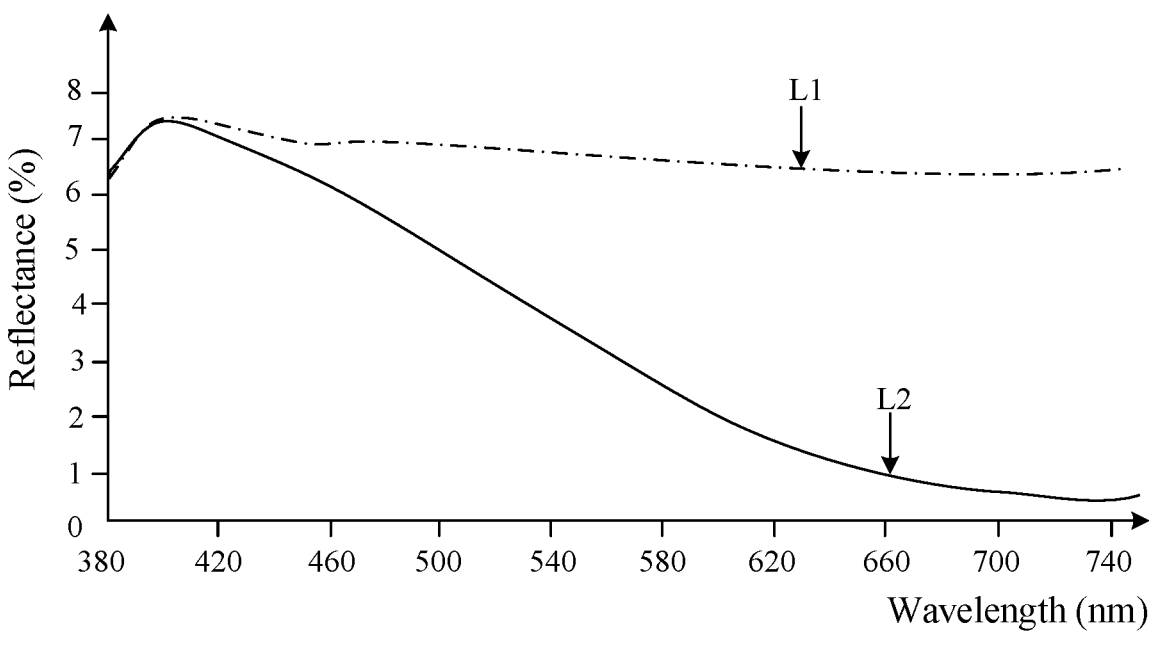
FIG. 19 is a graph showing a comparison between the reflectance of a display panel provided with an inorganic cover layer arranged therein and the reflectance of a display panel not provided with an inorganic cover layer according to some embodiments of the present disclosure.

In this case, for a clearer description, the reflectance of the display panel 000 provided with the inorganic cover layer 700 in the display panel is compared with the reflectance of the display panel not provided with the inorganic cover layer 700. Referring to FIG. 19, FIG. 19 is a graph showing a comparison between the reflectance of a display panel provided with the inorganic cover layer arranged therein and the reflectance of a display panel not provided with an inorganic cover layer according to some embodiments of the present disclosure. Here, the reflectance curve of the display panel not provided with the inorganic cover layer 700 is denoted as L1, and the reflectance curve of the display panel provided with the inorganic cover layer 700 arranged therein is denoted as L2. As can be seen from the figure, the reflectance of the display panel provided with the inorganic cover layer 700 arranged therein is particularly significantly reduced in the visible wavelength range. It should be noted that, the reflectance of the display panel 000 shown here is the reflectance obtained by considering only the second cover layer 600 and the inorganic cover layer 700, and does not include the reflectance obtained by the auxiliary color resistance structure 402 and the black matrix 300 in the above embodiment. Thus, the inorganic cover layer 700 effectively reduces the reflectance of the second cover layer 600 in the display panel 000.

In the present disclosure, the thickness of the inorganic cover layer 700 ranges from 500 angstroms to 1500 angstroms. Here, if the thickness of the inorganic cover layer 700 is less than 500 angstroms, ambient light is not totally reflected at the interface between the second cover layer 600 and the inorganic cover layer 700 after passing through the inorganic cover layer 700, thereby resulting in a high reflectance of the display panel. If the thickness of the inorganic cover layer 700 is greater than 1500 angstroms, the thickness of the display panel 000 increases, and warping and film layer separation easily occurs, thereby resulting in poor reliability of the display panel 000. Thus, in the present disclosure, the thickness of the inorganic cover layer 700 is greater than 500 angstroms and less than 1500 angstroms.

It should be noted that, since the inorganic cover layer 700 and the second cover layer 600 are arranged in a whole layer on a side, distal to the driver backplane 100, of the color resistance layer 400, the second cover layer 600 and the inorganic cover layer 700 are formed using the same mask, such that the manufacturing process of the display panel 000 is simple. It should be further noted that, the inorganic cover layer 700 is made of at least one of magnesium fluoride, silicon dioxide, aluminum oxide, silicon oxide, silicon nitride, titanium oxide, tantalum trioxide, and zinc sulfide.

Figure 20:
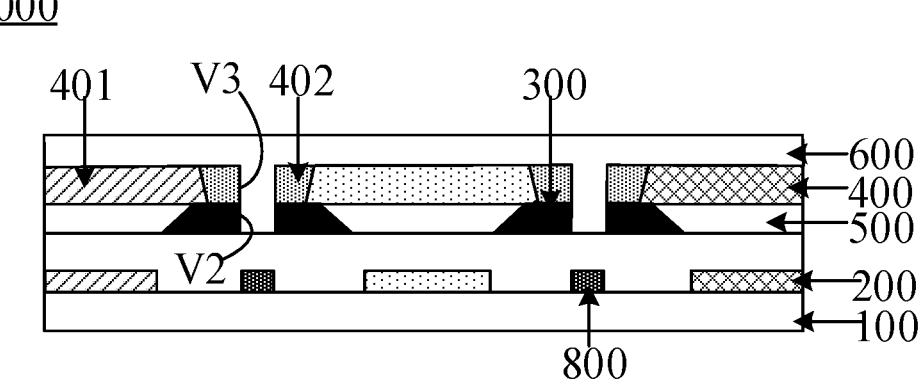
FIG. 20 is a schematic structural diagram of still another display panel according to some embodiments of the present disclosure.

In the embodiment of the present disclosure, referring to FIG. 20, FIG. 20 is a schematic structural diagram of still another display panel according to some embodiments of the present disclosure. The display panel 000 further includes a plurality of photosensitive devices 800 disposed on a side of the driver backplane 100, the black matrix 300 is further provided with a plurality of second light-passing holes V2 in one-to-one correspondence with the plurality of photosensitive devices 800, and the auxiliary color resistance structure 402 is provided with a plurality of third light-passing holes V3 in one-to-one correspondence with the plurality of photosensitive devices 800;

wherein an orthographic projection of each photosensitive device 800 onto the driver backplane 100 is at least partially overlapped with an orthographic projection of the second light-passing hole V2 corresponding to the photosensitive device 800 onto the driver backplane 100, and is at least partially overlapped with an orthographic projection of the third light-passing hole V3 corresponding to the photosensitive device 800 onto the driver backplane 100. Thus, the photosensitive device 800 senses the light emitted from the second light-passing holes V2 and the third light-passing holes V3, such that the photosensitive device 800 operates normally. Here, the photosensitive device 800 is photoresistors, photodiodes, phototriodes, or the like, which is not limited in the embodiments of the present disclosure.

In the present disclosure, a plurality of photosensitive devices 800 in the display panel 000 constitute a fingerprint sensor. Thus, after the user's finger contacts the display panel 000, the light-emitting devices 200 in the user's finger contact area in the display panel 000 emit light and are directed to the user's finger; then, after being reflected by the user's finger, the light emitted from the light-emitting devices 200 irradiate the corresponding photosensitive devices 800 from the second light-passing holes V2 and the third light-passing holes V3; and finally, the photosensitive devices 800 sense light with different light intensities reflected by the fingerprint valleys and the fingerprint ridges in the user's finger, such that the photosensitive devices 800 generate induced current based on the sensed light intensities, and then the display panel 000 generates image information corresponding to the user's fingerprint according to the induced current generated by the plurality of photosensitive devices 800.

It should be noted that, since the display panel 000 is provided with the auxiliary color resistance structure 401, although a plurality of photosensitive devices 800 are arranged in the display panel 000, the reflectance of the entire display panel 000 is relatively low. Thus, the display panel 000 according to the embodiment of the present disclosure is provided with a fingerprint sensor on the premise of reducing the reflectance of the display panel 000, such that the integration level of the display panel 000 is high.

In the embodiments of the present disclosure, the boundary of the orthographic projections of each photosensitive device 800 in the display panel 000 onto the driver backplane 100 is in coincidence with the boundary of the orthographic projection of the second light-passing hole V2 corresponding to the photosensitive device 800 onto the driver backplane 100, and is in coincidence with the boundary of the orthographic projection of the third light-passing hole V3 corresponding to the photosensitive device 800 onto the driver backplane 100. Thus, more target light is sensed by the photosensitive devices 800, such that the working effect of the fingerprint sensor is relatively good. Here, the target light is emitted from the light-emitting devices 200 and reflected by the user's finger toward the photosensitive devices 800.

In the present disclosure, as shown in FIG. 6, FIG. 8, FIG. 10, FIGS. 12 to 14, and FIGS. 16 to 17, the position of the third light-passing holes V3 in the color resistance layer 400 is the position of the photosensitive devices 800. Here, there are various arrangements of the color resistance blocks 401 in the display panel 000. Therefore, the arrangement of the plurality of photosensitive devices 800 and the color resistance blocks 401 have a plurality of arrangements corresponding thereto. The embodiments of the present disclosure only take the arrangement shown in FIG. 12 as an example for schematic description. Here, the positions of the light-passing holes V3 in the color resistance layer 400 shown in FIG. 12 are in one-to-one correspondence with the positions of the photosensitive devices 800. Since there are four pixels in the portion of the color resistance layer 400 shown in FIG. 12, and the four pixels have a color resistance block 401 in common, each pixel has one photosensitive device 800. Thus, there are four photosensitive devices 800 in this portion of the color resistance layer 400. It should be noted that, in other possible arrangements, the arrangement of the photosensitive devices 800 may refer to the arrangement shown in FIG. 6, FIG. 8, FIG. 10, FIGS. 13 to 14, and FIGS. 16 to 17, which is not repeated in the embodiments of the present disclosure.

Figure 21:
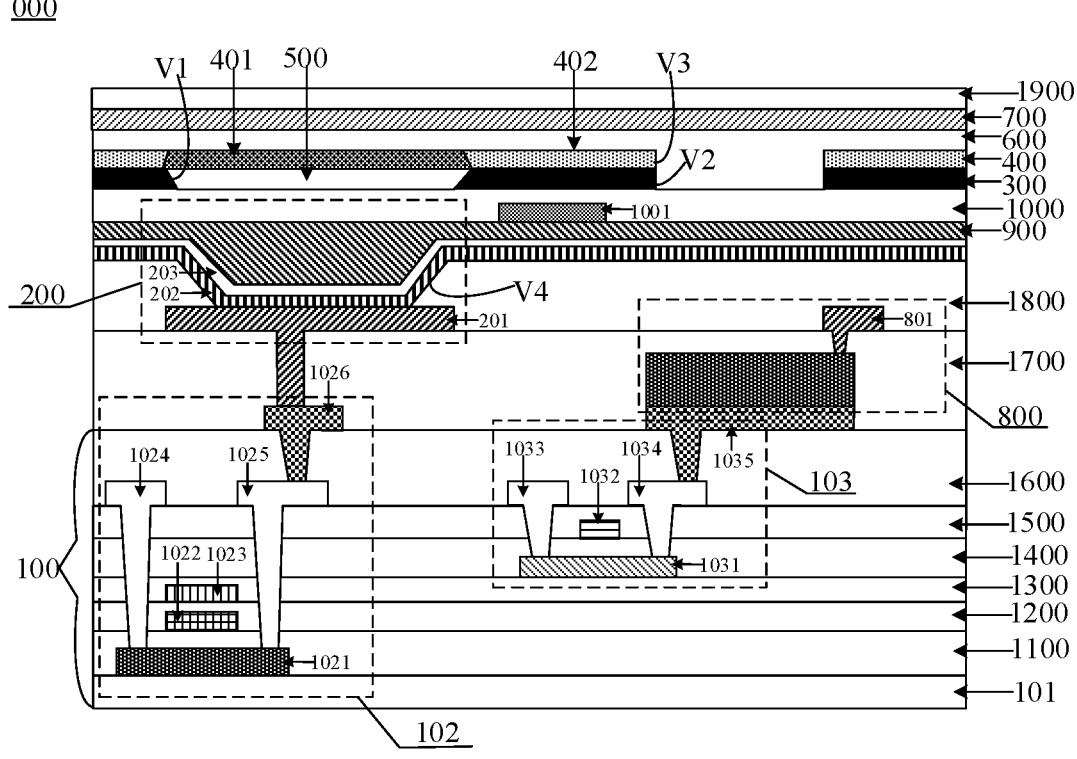
FIG. 21 is a schematic diagram of film layers of a display panel according to some embodiments of the present disclosure.

In the embodiments of the present disclosure, referring to FIG. 21, FIG. 21 is a schematic diagram of film layers of a display panel according to some embodiments of the present disclosure. The display panel 000 further includes a packaging layer 900 disposed on a side, distal to the driver backplane 100, of the plurality of light-emitting devices 200, and a touch layer 1000 disposed on a side, distal to the driver backplane 100, of the packaging layer 900.

The driver backplane 100 includes a substrate 101, and a plurality of pixel driver circuits 102 and a plurality of sensor driver circuits 103 on the substrate 101. The plurality of pixel driver circuits 102 are electrically connected to the plurality of light-emitting devices 200 in one-to-one correspondence, and the plurality of sensor driver circuits 103 are electrically connected to the plurality of photosensitive devices 800 in one-to-one correspondence.

Each pixel driver circuit 102 includes an active layer 1021, a first gate 1022, a second gate 1023, a source electrode 1024, a drain electrode 1025, and a first transfer electrode 1026. The active layer 1021 is insulated from the first gate 1022 by a first gate insulating layer 1100, the first gate 1022 is insulated from the second gate 1023 by a second gate insulating layer 1200, and the active layer 1021 is electrically connected to the source electrode 1024 and the drain electrode 1025, respectively. Typically, the source electrode 1024 and the drain electrode 1025 are disposed in the same layer, i.e., the source electrode 1024 and the drain electrode 1025 are a portion of a same conductive pattern. The conductive pattern in which the source electrode 1024 and the drain electrode 1025 are disposed is insulated from the second gate 1023 by an insulating layer.

Each of the sensor driver circuits 103 further includes an active layer 1031, a gate 1032, a source electrode 1033, a drain electrode 1034, and a second transfer electrode 1035. The second gate 1023 of the pixel driver circuit 102 is arranged to be insulated from the active layer 1031 of the sensor driver circuit 103 by the first insulating layer 1300. The active layer 1031 is insulated from the gate 1032 by a third gate insulating layer 1400, and the active layer 1031 is electrically connected to the source electrode 1033 and the drain electrode 1034, respectively. Typically, the source electrode 1033 and the drain electrode 1034 are disposed in the same layer, i.e., the source electrode 1033 and the drain electrode 1034 are a portion of a same conductive pattern. The conductive pattern in which the source electrode 1033 and the drain electrode 1034 are disposed is insulated from the second gate 1023 by the second insulating layer 1500.

It should be noted that, the conductive pattern in which the source electrode 1024 and the drain electrode 1025 are disposed in the pixel driver circuit 102 is arranged to be insulated from the second gate 1023 by the first insulating layer 1300, the third gate insulating layer 1400, and the second insulating layer 1500. Here, the active layer, the first gate, the second gate, the source electrode, and the drain electrode in the pixel driver circuit 102 constitute a thin film transistor, and in the embodiments of the present disclosure, the case where a thin film transistor is taken as a top-gate-type thin film transistor is schematically illustrated as examples. In other optional implementations, the thin film transistor may also be a bottom-gate-type thin film transistor, which is not limited in the embodiment of the present disclosure. Similarly, the sensor driver circuits 103 also constitutes a top-gate-type thin film transistor, which is not limited in the embodiments of the present disclosure.

In the present disclosure, one of the source electrode 1033 or the drain electrode 1034 in the sensor driver circuit 103 is electrically connected to the photosensitive device 800 through the second transfer electrode 1035. One of the source electrode 1024 and the drain electrode 1025 in the pixel driver circuit 102 is electrically connected to the light-emitting device 200 through the first transfer electrode 1026. The second transfer electrode 1035 is arranged to be insulated from the conductive layer where the source electrode 1033 and the drain electrode 1034 are disposed by the third insulating layer 1600, and the first transfer electrode 1026 is also arranged to be insulated from the conductive layer where the source electrode 1024 and the drain electrode 1025 are disposed by the third insulating layer 1600.

The light-emitting device 200 includes a plurality of anode layers 201, light-emitting layers 202, and cathode layers 203 which are arranged in a stacked manner. The light-emitting device 200 is an organic light emitting display (OELD). Here, each pixel driver circuit 102 is electrically connected to the anode layer 201 in the corresponding light-emitting device 200 through the first transfer electrode 1026. For example, a first planarization layer 1700 is arranged between the first transfer electrode 1026 and the anode layer 201.

The photosensitive device 800 includes a driver electrode 801 disposed on a side, distal to the substrate 101, of the photosensitive device 800. The driver electrode 801 is electrically connected to the photosensitive device 800. In the case that the photosensitive device 800 operates, the display panel 000 applies an operating voltage to the photosensitive device 800 through the driver electrode 801 to enable the photosensitive device 800 to sense light. The first planarization layer 1700 is arranged between the driver electrode 801 and the second transfer electrode 1035. Here, the orthographic projection of the driver electrode 801 onto the driver backplane 100 is not overlapped with the orthographic projections of the third light-passing holes V3 onto the driver backplane 100; the orthographic projection of the driver electrode 801 onto the driver backplane 100 is not overlapped with the orthographic projection of the second light-passing holes V2 onto the driver backplane 100. Thus, the light reflected by the user's finger is not reflected by the driver electrode 801, resulting in a poor sensing effect of the photosensitive devices 800.

It should be noted that, the active layer 1021, the first gate 1022, and the second gate 1023 in the pixel driver circuit 102 are all manufactured through a low-temperature polysilicon process. The active layer 1031, the gate 1032, the source electrode 1033, the drain electrode 1034, and the second transfer electrode 1035 of the sensor driver circuit 103 are all manufactured through a low-temperature polycrystalline oxide process. Thus, noise generated in the working process of the photosensitive device 800 is reduced, such that the sensing effect of the fingerprint sensor is relatively good.

It should be further noted that, the source electrode 1024 and the drain electrode 1025 of the pixel driver circuit 102 and the source electrode 1033 and the drain electrode 1034 of the sensor driver circuit 103 are formed by a single patterning process. The first transfer electrode 1026 and the second transfer electrode 1035 are also formed by a single patterning process. The anode layer 201 and the driver electrode 801 are also formed by a single patterning process. Both the above single patterning process and the single patterning process in the following embodiments include photoresist coating, exposure, development, etching, and photoresist stripping. Here, in some possible implementations, since the driver electrode 801 is generally manufactured by multiple conductive layers, in the case that the driver electrode 801 is manufactured from the plurality of conductive layers, a metal conductive layer of the plurality of conductive layers is formed with the anode layer 201 by a single patterning process.

The display panel 000 further includes a pixel definition layer 1800. The portion of the pixel definition layer 1800 disposed in the display region is provided with a plurality of pixel holes V4. In each pixel hole V4, a portion of the anode layer 201 disposed in the pixel hole V4, a portion of the light-emitting layer 202 disposed in the pixel hole V4, and a portion of the cathode layer 203 disposed in the pixel hole V4 constitutes one light-emitting device 200.

The packaging layer 900 includes a first inorganic packaging layer, an organic packaging layer, and a second inorganic packaging layer which are arranged in a stacked manner. The packaging layer 900 is configured to package the light-emitting device 200, so as to prevent the light-emitting layer 202 in the light-emitting device 200 from being corroded by moisture, oxygen and other components in the air, resulting in damage. Thus, the service life of the light-emitting device 200 is effectively prolonged by the packaging layer 900.

The touch layer 1000 is disposed between the packaging layer 900 and the black matrix 300. The touch layer 1100 includes transparent touch electrodes (not shown in the figure) and touch signal lines 1001 electrically connected to the touch electrodes. The orthographic projections of the touch signal lines 1001 onto the driver backplane 100 are not overlapped with the orthographic projections of the plurality of photosensitive devices 800 onto the driver backplane 100. Thus, after the user's finger contacts the display panel 000, the touch layer 1000 in the display panel 000 obtains the position information of the area where the user's finger contacts the display panel according to the current change on the touch electrodes, such that the light-emitting devices 200 in the area where the user's finger contacts emit light.

In the present disclosure, since the touch signal lines 1001 are usually made of metal, the touch signal lines 1001 are disposed within the orthographic projection of the black matrix 300 onto the driver backplane 100, that is, the touch signal lines 1001 are not overlapped with the photosensitive devices 800, such that the light emitted from the light-emitting devices 200 are not reflected by the touch signal lines 1001, and then the photosensitive effect of the photosensitive devices 800 is relatively good.

In the embodiment of the present disclosure, the display panel 000 is a foldable display panel, and the display panel 000 further includes an ultra-thin glass UTG cover plate 1900 disposed on a side, distal to driver backplane 100, of the color resistance layer 400. Here, the ultra-thin glass UTG cover plate 1900 is a transparent glass having a certain flexibility such that the display panel 000 is bendable. For example, the ultra-thin glass UTG cover plate 1900 is made of ultra-thin glass (UTG). The embodiments of the present disclosure take the case where an example in which the ultra-thin glass UTG cover plate 1900 is disposed on a side, distal to the driver backplane 100, of the inorganic cover layer 700 as an example for schematic description. In other possible implementations, the ultra-thin glass UTG cover plate 1900 may also be disposed on a side, proximal to the driver backplane 100, of the inorganic cover layer 700, which is not limited in the embodiments of the present disclosure.

In the present disclosure, in the case that the photosensitive devices 800 are included in the display panel 000, there may be a plurality of possible structures of the display panel 000, and the embodiments of the present disclosure take the following three possible structures as examples for schematic description.

Figure 22:
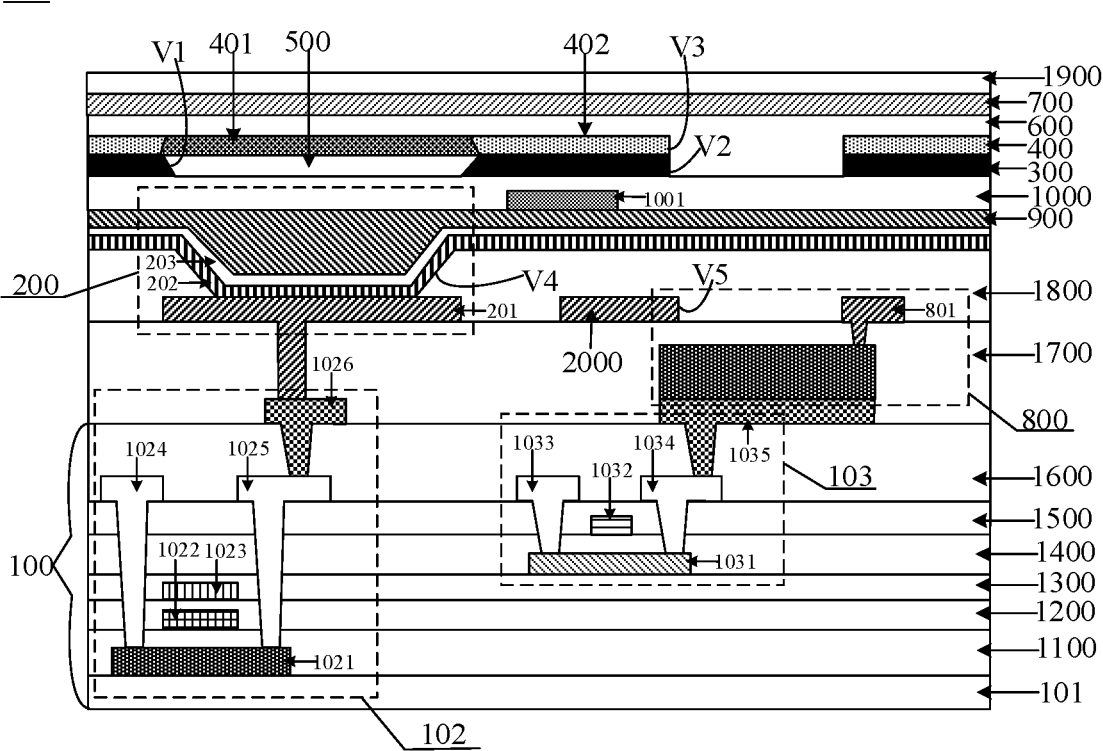
FIG. 22 is a schematic diagram of film layers of another display panel according to some embodiments of the present disclosure.

For the first possible structure, referring to FIG. 22, FIG. 22 is a schematic diagram of film layers of another display panel according to some embodiments of the present disclosure. In the case that the photosensitive devices 800 are included in the display panel 000, the display panel 000 further includes an auxiliary structure 2000 arranged on a same layer as the driver electrode 801, the auxiliary structure 2000 has no electrical connection with the driver electrode 801 and the anode layer 201. Fourth light-passing holes V5 are formed between the auxiliary structure 2000 and the driver electrode 801, wherein the plurality of fourth light-passing holes V5 are in one-to-one correspondence with the plurality of third light-passing holes V3, and the plurality of fourth light-passing holes V5 are also in one-to-one correspondence with the plurality of second light-passing holes V2. Thus, light reflected by the user's finger passes through the third light-passing holes V3, the second light-passing holes V2, and the fourth light-passing holes V5 in sequence to be sensed by the photosensitive devices 800.

It should be noted that, the orthographic projections of the fourth light-passing holes V5 onto the driver backplane 100 fall within the orthographic projections of the third light-passing holes V3 of the auxiliary color resistance structure 402 onto the driver backplane 100; and the orthographic projections of the fourth light-passing holes V5 onto the driver backplane 100 fall within the orthographic projections of the second light-passing holes V2 of the black matrix 300 on the driver backplane 100. Thus, after the user's finger contacts the display panel 000, light within a certain angle of light reflected by the user's finger irradiates the photosensitive devices 800, such that the sensing effect of the photosensitive devices 800 is relatively good.

Figure 23:
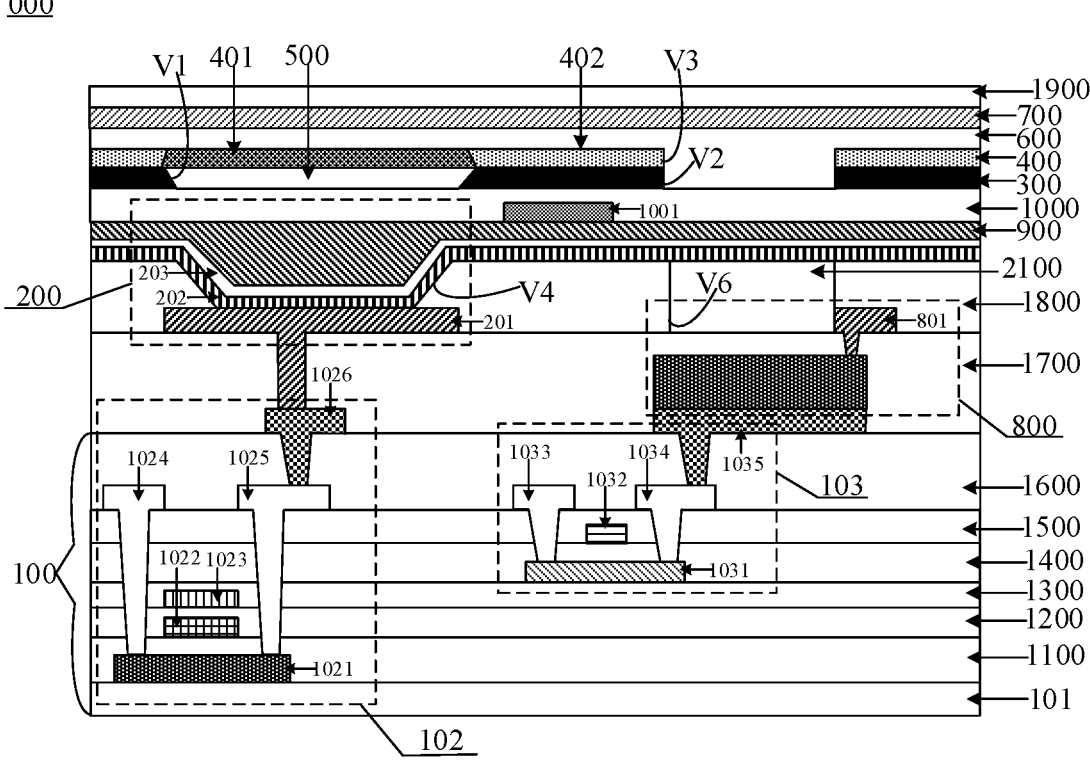
FIG. 23 is a schematic diagram of film layers of yet another display panel according to some embodiments of the present disclosure.

For the second possible structure, referring to FIG. 23, FIG. 23 is a schematic diagram of film layers of yet another display panel according to some embodiments of the present disclosure. The pixel definition layer 1800 in the display panel 000 is a black pixel definition layer 1800, and the pixel definition layer 1800 is provided with a plurality of fifth light-passing holes V6 corresponding to the photosensitive devices 800. Thus, in the case that the ambient light irradiates the display panel, the black pixel definition layer 1800 further absorbs the ambient light irradiating the display panel 000, such that the reflectance of the display panel 000 is relatively low. In addition, the plurality of fifth light-passing holes V6 are in one-to-one correspondence with the plurality of third light-passing holes V3, and the plurality of fifth light-passing holes V6 are also in one-to-one correspondence with the plurality of second light-passing holes V2. Thus, light reflected by the user's finger passes through the third light-passing holes V3, the second light-passing holes V2, and the fifth light-passing holes V6 in sequence to be sensed by the photosensitive devices 800.

It should be noted that, the orthographic projections of the fifth light-passing holes V6 onto the driver backplane 100 fall within the orthographic projections of the third light-passing holes V3 of the auxiliary color resistance structure 402 onto the driver backplane 100; and the orthographic projections of the fifth light-passing holes V6 onto the driver backplane 100 fall within the orthographic projections of the second light-passing holes V2 of the black matrix 300 onto the driver backplane 100. Thus, after the user's finger contacts the display panel 000, light within a certain angle of light reflected by the user's finger irradiates the photosensitive devices 800, such that the sensing effect of the photosensitive devices 800 is relatively good.

In this case, the display panel 000 further includes a first transparent planarization layer 2100 disposed between the black pixel definition layer 1800 and the light-emitting layer 202 in the light-emitting device 200. Thus, the display panel 000 is provided with a first transparent planarization layer 2100 on the premise of reducing the reflectance of the display panel 000, such that the appearance of the light-emitting layer 202 and the cathode layer 203 in the light-emitting device 200 is relatively good, and the reliability of the light-emitting device 200 is relatively high.

Figure 24:
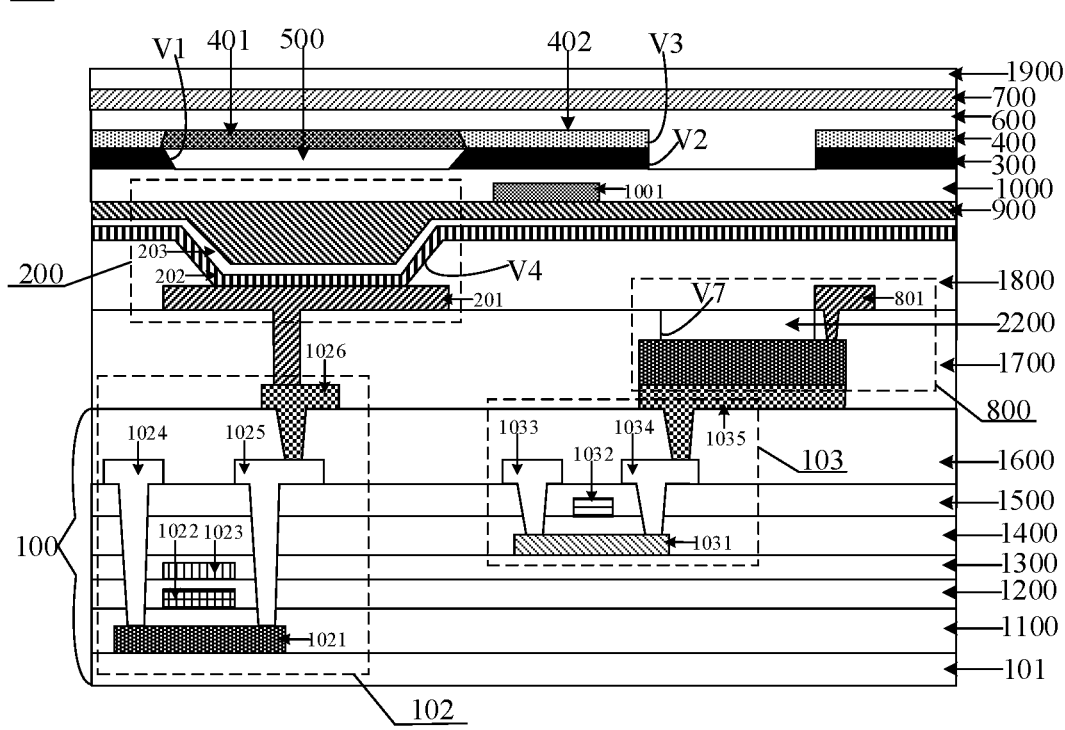
FIG. 24 is a schematic diagram of film layers of still another display panel according to some embodiments of the present disclosure.

For the third possible structure, referring to FIG. 24, FIG. 24 is a schematic diagram of film layers of still another display panel according to some embodiments of the present disclosure. In the case that the photosensitive devices 800 are included in the display panel 000, the first planarization layer 1700 in the display panel 000 is a black first planarization layer 1700, and the first planarization layer 1700 is provided with a plurality of sixth light-passing holes V7 corresponding to the photosensitive devices 800. Thus, in the case that the ambient light irradiates the display panel, the black first planarization layer 1700 further absorbs the ambient light irradiating the display panel 000, such that the reflectance of the display panel 000 is relatively low. In addition, the plurality of sixth light-passing holes V7 are in one-to-one correspondence with the plurality of third light-passing holes V3, and the plurality of sixth light-passing holes V7 are also in one-to-one correspondence with the plurality of second light-passing holes V2. Thus, light reflected by the user's finger passes through the third light-passing holes V3, the second light-passing holes V2, and the sixth light-passing holes V7 in sequence to be sensed by the photosensitive devices 800.

It should be noted that, the orthographic projections of the sixth light-passing holes V7 onto the driver backplane 100 fall within the orthographic projections of the third light-passing holes V3 of the auxiliary color resistance structure 402 onto the driver backplane 100; and the orthographic projections of the sixth light-passing holes V7 onto the driver backplane 100 fall within the orthographic projections of the second light-passing holes V2 of the black matrix 300 onto the driver backplane 100. Thus, after the user's finger contacts the display panel 000, light within a certain angle of light reflected by the user's finger irradiates the photosensitive devices 800, such that the sensing effect of the photosensitive devices 800 is relatively good.

In this case, the display panel 000 further includes a second transparent planarization layer 2200 disposed between the black pixel definition layer 1800 and the first planarization layer 1700. Thus, the display panel 000 is provided with a second transparent planarization layer 2200 on the premise of reducing the reflectance of the display panel 000, such that the appearance of the light-emitting layer 202 and the cathode layer 203 in the light-emitting device 200 is relatively good, and the reliability of the light-emitting device 200 is relatively high.

In summary, the display panel according to the embodiments of the present disclosure includes a driver backplane, light-emitting devices, a black matrix, and a color resistance layer. wherein the color resistance layer is provided with color resistance blocks corresponding to the light-emitting devices and auxiliary color resistance structure corresponding to the black matrix. Due to the fact that the orthographic projection of the auxiliary color resistance structure onto the driver backplane is at least partially overlapped with the orthographic projection of the black matrix onto the driver backplane, in the case that the ambient light irradiates the display panel, the ambient light irradiates the black matrix after passing through the auxiliary color resistance structure, such that the intensity of the ambient light irradiating the black matrix is reduced. That is, for the ambient light irradiating the black matrix in the display panel, most of the light is absorbed by the auxiliary color resistance structure in the process of passing through the auxiliary color resistance structure, and only a small portion of the light is reflected by the surface of the black matrix out of the display panel. In this way, the reflectance of the display panel is effectively reduced, such that the light intensity of the ambient light reflected by the display panel does not cause a great interference to the light emitted from the light-emitting devices of the display panel, thereby improving the reliability of the display panel.

The embodiments of the present disclosure further provide a display device. The display device is any product or component with a display function, such as a mobile phone, a tablet computer, a television, a display, a notebook computer, a digital photo frame, and a navigator. The display device includes a power supply assembly and a display panel 000, wherein the display panel 000 is an OLED display panel or an active matrix-organic light emitting diode (AM-OLED) display panel.

In the embodiments of the present disclosure, the display panel 000 is the display panel 000 in the above embodiments. For example, it may be the display panel shown in FIG. 2, FIG. 3, FIG. 18, FIG. 20, FIG. 21, FIG. 22, FIG. 23, or FIG. 24. The power supply assembly is connected to the display panel 000 and is configured to supply power to the display panel 000.

It should be noted that, in the drawings, the sizes of the layers and areas may be exaggerated for clarity of illustration. Also, it can be understood that, in the case that an element or layer is referred to as being "on" another element or layer, it may be directly on the other element, or an intermediate layer may be present. In addition, it can be understood that, in the case that an element or layer is referred to as being "under" another element or layer, it may be directly under the other element, or one or more intermediate layers or elements may be present. In addition, it can also be understood that, in the case that a layer or element is referred to as being "between" two layers or elements, it may be the only layer between the two layers or elements, or one or more intermediate layers or elements may also be present. Like reference numerals refer to like elements throughout the present disclosure.

In the present disclosure, the terms "first" and "second" are merely used for descriptive purposes and should not be construed as indicating or implying the relative importance. The term "a plurality of" refers to two or more, unless otherwise explicitly defined.

Described above are merely optional embodiments of the present disclosure and are not intended to limit the present disclosure. Any modifications, equivalents, improvements, and the like, made within the spirit and principle of the present disclosure should fall within the protection scope of the present disclosure.

The invention claimed is:

1. A display panel, comprising:
a driver backplane;
a plurality of light-emitting devices disposed on a side of the driver backplane;
a black matrix disposed on a side, distal to the driver backplane, of the plurality of light-emitting devices, wherein the black matrix is provided with a plurality of first light-passing holes in one-to-one correspondence with the plurality of light-emitting devices, and an orthographic projection of each light-emitting device onto the driver backplane falls within an orthographic projection of the first light-passing hole corresponding to the light-emitting device onto the driver backplane; and
a color resistance layer disposed on a side, distal to the driver backplane, of the black matrix, wherein the color resistance layer comprises a plurality of color resistance blocks in one-to-one correspondence with the plurality of first light-passing holes, and an auxiliary color resistance structure disposed between any adjacent color resistance blocks;
wherein an orthographic projection of each first light-passing hole onto the driver backplane falls within an orthographic projection of the color resistance block corresponding to the first light-passing hole onto the driver backplane, and an orthographic projection of the auxiliary color resistance structure onto the driver backplane is at least partially overlapped with orthographic projections of the black matrix onto the driver backplane.

2. The display panel according to claim 1, wherein the auxiliary color resistance structure is provided with a plurality of opening areas in one-to-one correspondence with the plurality of color resistance blocks, and a boundary of an orthographic projection of each opening area onto the driver backplane is in coincidence with a boundary of the orthographic projection of the color resistance block corresponding to the opening area onto the driver backplane.

3. The display panel according to claim 2, wherein the orthographic projection of the black matrix onto the driver backplane falls within the orthographic projection of the auxiliary color resistance structure onto the driver backplane.

4. The display panel according to claim 1, wherein the plurality of color resistance blocks comprise at least two types of color resistance blocks with different colors, a color of the auxiliary color resistance structure being the same as a color of at least one type of the color resistance blocks.

5. The display panel according to claim 4, wherein the plurality of color resistance blocks comprise red color resistance blocks, green color resistance blocks, and blue color resistance blocks;

the color of each portion in the auxiliary color resistance structure is the same, and the color of the auxiliary color resistance structure is any one of red, green, or blue;

or the auxiliary color resistance structure comprises at least two of a first portion having a same color as the red color resistance block, a second portion having a same color as the green color resistance block, and a third portion having a same color as the blue color resistance block.

6. The display panel according to claim 5, wherein in a case that the auxiliary color resistance structure comprises a first portion, the first portion is at least distributed on one side of the red color resistance block; in a case that the auxiliary color resistance structure comprises a second portion, the second portion is at least distributed on one side of the green color resistance block; in a case that the auxiliary color resistance structure comprises a third portion, the third portion is at least distributed on one side of the blue color resistance block.

7. The display panel according to claim 5, wherein in a case that the auxiliary color resistance structure comprises a first portion, a second portion, and a third portion, an area of an orthographic projection of the third portion onto the driver backplane is smaller than an area of an orthographic projection of the first portion onto the driver backplane, and is larger than an area of an orthographic projection of the second portion onto the driver backplane.

8. The display panel according to claim 1, wherein the display panel further comprises a first cover layer disposed between the black matrix and the color resistance layer, a thickness of the first cover layer being greater than or equal to a thickness of the black matrix.

9. The display panel according to claim 8, wherein the display panel further comprises: a second cover layer disposed on a side, distal to the driver backplane, of the color resistance layer, and an inorganic cover layer disposed on a side, distal to the driver backplane, of the second cover layer, a refractive index of the inorganic cover layer being greater than a refractive index of the second cover layer.

10. The display panel according to claim 9, wherein a thickness of the inorganic cover layer ranges from 500 angstroms to 1500 angstroms.

11. The display panel according to claim 1, wherein the display panel further comprises a plurality of photosensitive devices disposed on one side of the driver backplane, the black matrix is further provided with a plurality of second light-passing holes in one-to-one correspondence with the plurality of photosensitive devices, and the auxiliary color resistance structure is provided with a plurality of third light-passing holes in one-to-one correspondence with the plurality of photosensitive devices;

wherein an orthographic projection of each photosensitive device onto the driver backplane is at least partially overlapped with an orthographic projection of the second light-passing hole corresponding to the photosensitive device onto the driver backplane, and is at least partially overlapped with an orthographic projection of the third light-passing hole corresponding to the photosensitive device onto the driver backplane.

12. The display panel according to claim 11, wherein a boundary of the orthographic projection of the photosensitive device onto the driver backplane is in coincidence with a boundary of the orthographic projection of the corresponding second light-passing hole onto the driver backplane, and is in coincidence with a boundary of the orthographic projection of the corresponding third light-passing hole onto the driver backplane.

13. The display panel according to claim 11, wherein the display panel further comprises a packaging layer disposed on a side, distal to the driver backplane, of the plurality of light-emitting devices, and a touch layer disposed on a side, distal to the driver backplane, of the packaging layer;

wherein the touch layer is disposed between the packaging layer and the black matrix and is provided with a touch signal line, an orthographic projection of the touch signal line onto the driver backplane being not overlapped with the orthographic projections of the plurality of photosensitive devices onto the driver backplane.

14. The display panel according to claim 11, wherein the display panel is a foldable display panel and further comprises an ultra-thin glass UTG cover plate disposed on a side, distal to the driver backplane, of the color resistance layer.

15. A display device, comprising: a power supply assembly and a display panel, wherein the power supply assembly is configured to supply power to the display panel, and the display panel comprises:

a driver backplane;

a plurality of light-emitting devices disposed on a side of the driver backplane;

a black matrix disposed on a side, distal to the driver backplane, of the plurality of light-emitting devices, wherein the black matrix is provided with a plurality of first light-passing holes in one-to-one correspondence with the plurality of light-emitting devices, and an orthographic projection of each light-emitting device onto the driver backplane falls within an orthographic projection of the first light-passing hole corresponding to the light-emitting device onto the driver backplane; and a color resistance layer disposed on a side, distal to the driver backplane, of the black matrix, wherein the color resistance layer comprises a plurality of color resistance blocks in one-to-one correspondence with the plurality of first light-passing holes, and an auxiliary color resistance structure disposed between any adjacent color resistance blocks;

wherein an orthographic projection of each first light-passing hole onto the driver backplane falls within an orthographic projection of the color resistance block corresponding to the first light-passing hole onto the driver backplane, and an orthographic projection of the auxiliary color resistance structure onto the driver backplane is at least partially overlapped with orthographic projections of the black matrix onto the driver backplane.

16. The display device according to claim 15, wherein the auxiliary color resistance structure is provided with a plurality of opening areas in one-to-one correspondence with the plurality of color resistance blocks, and a boundary of an orthographic projection of each opening area onto the driver backplane is in coincidence with a boundary of the orthographic projection of the color resistance block corresponding to the opening area onto the driver backplane.

17. The display device according to claim 16, wherein the orthographic projection of the black matrix onto the driver backplane falls within the orthographic projection of the auxiliary color resistance structure onto the driver backplane.

18. The display device according to claim 15, wherein the plurality of color resistance blocks comprise at least two types of color resistance blocks with different colors, a color of the auxiliary color resistance structure being the same as a color of at least one type of the color resistance blocks.

19. The display device according to claim 18, wherein the plurality of color resistance blocks comprise red color resistance blocks, green color resistance blocks, and blue color resistance blocks;

the color of each portion in the auxiliary color resistance structure is the same, and the color of the auxiliary color resistance structure is any one of red, green, or blue;

or the auxiliary color resistance structure comprises at least two of a first portion having a same color as the red color resistance block, a second portion having a same color as the green color resistance block, and a third portion having a same color as the blue color resistance block.

20. The display device according to claim 19, wherein in a case that the auxiliary color resistance structure comprises a first portion, the first portion is at least distributed on one side of the red color resistance block; in a case that the auxiliary color resistance structure comprises a second portion, the second portion is at least distributed on one side of the green color resistance block; in a case that the auxiliary color resistance structure comprises a third portion, the third portion is at least distributed on one side of the blue color resistance block.

* * * * *